United States Patent
Yanagihara

(10) Patent No.: US 7,652,282 B2
(45) Date of Patent: Jan. 26, 2010

(54) SEMICONDUCTOR WAFER, DEVICES MADE THEREFROM, AND METHOD OF FABRICATION

(75) Inventor: Masataka Yanagihara, Saitama (JP)

(73) Assignee: Sanken Electric Co., Ltd. (JP)

( * ) Notice: Subject to any disclaimer, the term of this patent is extended or adjusted under 35 U.S.C. 154(b) by 141 days.

(21) Appl. No.: 12/038,218

(22) Filed: Feb. 27, 2008

(65) Prior Publication Data

US 2008/0203382 A1 Aug. 28, 2008

(30) Foreign Application Priority Data

Feb. 28, 2007 (JP) ............................. 2007-049792

(51) Int. Cl.
*H01L 29/06* (2006.01)
*H01L 29/201* (2006.01)
*H01L 29/732* (2006.01)
*H01L 21/338* (2006.01)

(52) U.S. Cl. ................. 257/19; 257/194; 257/E33.016; 257/E29.249; 257/E21.126; 438/167; 438/172

(58) Field of Classification Search .................... 257/19, 257/194, E21.126, E29.249, E33.016; 438/167, 438/172

See application file for complete search history.

(56) References Cited

U.S. PATENT DOCUMENTS 6,133,593 A * 10/2000 Boos et al. .................. 257/194

(Continued)

FOREIGN PATENT DOCUMENTS

JP 2003-059948 2/2003

OTHER PUBLICATIONS

Feltin, E. et al., "Stress Control in GaN Grown on Silicon (111) by Metalorganic Vapor Phase Epitaxy", Applied Physics Letters, Nov. 2001, 79(20), 3230-3232.

(Continued)

*Primary Examiner*—Fernando L Toledo
(74) *Attorney, Agent, or Firm*—Woodcock Washburn LLP

(57) ABSTRACT

A main semiconductor region of semiconducting nitrides is formed on a silicon substrate via a buffer region of semiconducting nitrides to provide devices such as HEMTs, MESFETs and LEDs. In order to render the wafer proof against warping, the buffer region is divided into a first and a second multilayered buffer subregion. The first buffer subregion comprises multiple alterations of a multi-sublayered first buffer layer and a non-sublayered second buffer layer. Each multi-sublayered first buffer layer of the first buffer subregion comprises multiple alternations of a first and a second buffer sublayer. The second buffer sublayers of each multi-sublayered first buffer layer either do not contain aluminum or do contain it in a higher proportion than do the first buffer sublayers. The second multilayered buffer subregion comprises multiple alternations of a first and a second buffer layer. The first buffer layers of the second multilayered buffer subregion are less in aluminum proportion than the fourth buffer layers of the second multilayered buffer subregion.

22 Claims, 8 Drawing Sheets

U.S. PATENT DOCUMENTS

| | | | |
|---|---|---|---|
| 6,841,435 B2 * | 1/2005 | Udagawa et al. | 438/167 |
| 7,321,132 B2 * | 1/2008 | Robinson et al. | 257/12 |
| 7,541,232 B2 * | 6/2009 | Robinson et al. | 438/172 |
| 7,582,891 B2 * | 9/2009 | Kouvetakis et al. | 257/14 |
| 2003/0008440 A1 * | 1/2003 | Udagawa et al. | 438/167 |
| 2006/0208279 A1 * | 9/2006 | Robinson et al. | 257/194 |
| 2008/0090345 A1 * | 4/2008 | Robinson et al. | 438/172 |
| 2008/0135830 A1 * | 6/2008 | Westhoff et al. | 257/19 |
| 2008/0277647 A1 * | 11/2008 | Kouvetakis et al. | 257/19 |

OTHER PUBLICATIONS

Nikishin, S.A. et al., "High Quality GaN Grown on Si(111) by Gas Source Molecular Epitaxy with Ammonia", Applied Physics Letters, Oct. 4, 1999, 75(14), 2073-2075.

* cited by examiner

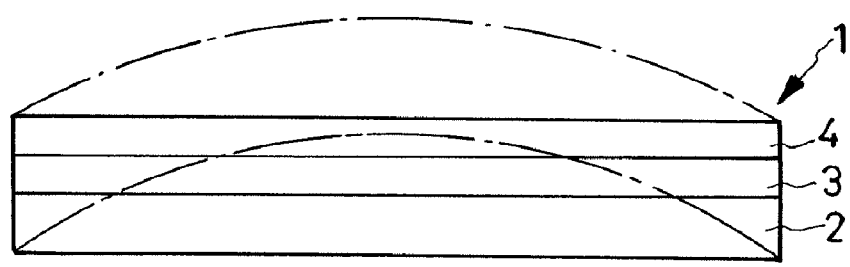
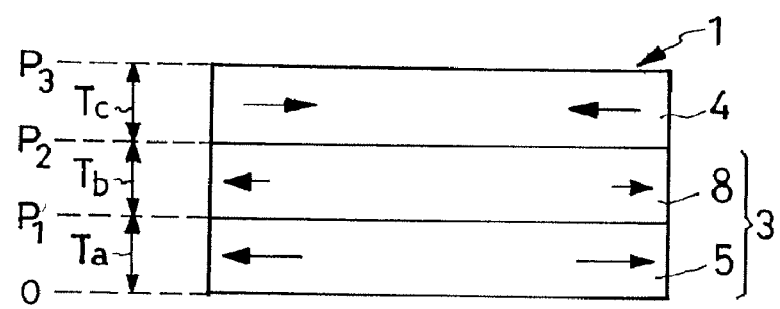

US 7,652,282 B2

SEMICONDUCTOR WAFER, DEVICES MADE THEREFROM, AND METHOD OF FABRICATION

CROSS REFERENCE TO RELATED APPLICATIONS

This application claims priority to Japanese Patent Application No. 2007-049792, filed Feb. 28, 2007.

BACKGROUND OF THE INVENTION

This invention relates to semiconductor wafers, and particularly to those having nitride semiconductors grown by epitaxy on a substrate of silicon, silicon compounds or the like. The invention also specifically pertains to semiconductor devices manufacturable from the wafers, such for example as high-electron-mobility transistors (HEMTs), metal semiconductor field-effect transistors (MESFETs), and light-emitting diodes (LEDs), and to a method of making such wafers.

The semiconductor wafer having layers of nitride semiconductors grown on a silicon substrate by epitaxy has been known, as disclosed for example in Japanese Unexamined Patent Publication No. 2003-59948. Silicon is preferred as a less expensive substitute for sapphire as a substrate material. However, a problem has been encountered in use of a silicon substrate in this type of wafer by reason of an inconveniently great difference in coefficient of linear thermal expansion between the silicon substrate and the nitride semiconductors grown thereon. The linear expansion coefficient of silicon is approximately $4.70 \times 10^{-6}$/K whereas that of gallium nitride, for example, is $5.59 \times 10^{-6}$/K. Other semiconducting nitrides are more or less equally higher in linear expansion coefficient than silicon. What is worse, silicon and semiconducting nitrides also differ in lattice constant. Therefore, grown directly on the silicon substrate, the nitride layers have been unavoidably stressed, with consequent development of cracks or dislocations therein.

A conventional remedy to this inconvenience, as taught by the Japanese patent application cited above, is an interposition of a multilayered buffer between the silicon substrate and the nitride semiconductor region. The multilayered buffer is designed to mitigate the stresses exerted on the nitride semiconductor region, protecting the same against cracking and dislocations.

This solution has proved unsatisfactory, however, particularly as semiconductor manufactures today are bent upon developing and using larger wafers for reduction of production costs. The wafers formed by growing the nitride semiconductor region on the silicon substrate via the buffer have proved to become increasingly more susceptible to warpage as the nitride semiconductor region grows thicker and, moreover, as the wafer increases in surface area or diameter. Thicker nitride semiconductor regions, however, have their own merit: They enable the resulting devices to withstand higher voltages in their thickness direction. Indeed, the thicker the nitride semiconductor region, the greater is the antivoltage strength in its thickness direction. Larger wafers are directly conducive to the curtailment of manufacturing costs, for a larger wafer yields a greater batch of devices than does a smaller one.

Another known method of growing a nitride semiconductor on a silicon substrate is found in "High Quality GaN Grown on Si(111) by Gas Source Molecular Beam Epitaxy with Ammonia" by Nikishin et al. in the volume 75, number 14 of Applied Physics Letters dated Oct. 4, 1999. Nikishin et al. teach a superlattice buffer between a silicon substrate and a main semiconductor region of GaN for providing the desired working parts of desired semiconductor devices. The superlattice buffer incorporates two superlattices each having alternating AlGaN and GaN layers, with an additional GaN layer interposed therebetween. An alternative method is reported in "Stress Control in GaN Grown on Silicon (111) by Metalorganic Vapor Phase Epitaxy" by Feltin et al. in the volume 79, number 20 of Applied Physics Letters dated Nov. 21, 2001. Feltin et al. employ AlN/GaN superlattices in lieu of the AlGaN/GaN superlattices of Nikishin et al.

The foregoing two prior art buffer configurations serve each in its own way to save the GaN layers from cracking and to improve their crystallinity. However, they are not explicitly designed for elimination of wafer warpage. It has indeed proved that they leave this problem unremedied, especially with wafers that must be made comparatively thick for higher antivoltage strength.

SUMMARY OF THE INVENTION

The present invention has it as an object to reduce the warpage of semiconductor wafers of the class defined to a minimum.

Another object of the invention is to achieve the first recited object in semiconductor wafers that can be made thick enough for the resulting devices to attain a desired degree of antivoltage strength.

Briefly, the invention may be summarized as a semiconductor wafer for use in fabrication of semiconductor devices such for example as HEMTs, MESFETs and LEDs. The wafer comprises a substrate, a buffer region made from semiconducting compounds on the substrate, and a main semiconductor region made from semiconducting compounds on the buffer region to provide desired semiconductor devices. The invention is specifically directed to a new and improved configuration of the buffer region, which is designed as follows to accomplish the objects of the invention stated above.

The buffer region of the wafer comprises a first and a second multilayered buffer subregion. Formed on the substrate, the first multilayered buffer subregion of the buffer region comprises alternations of a multi-sublayered first buffer layer and a non-sublayered second buffer layer. Each multi-sublayered first buffer layer of the first multilayered buffer subregion comprises alternations of a first and a second buffer sublayer. The first buffer sublayers of the multi-sublayered first buffer layers are each thinner than each non-sublayered second buffer layer and less in lattice constants than the substrate. The second buffer sublayers of the multi-sublayered first buffer layers are each thinner than each non-sublayered second buffer layer and intermediate in lattice constants between the first buffer sublayers of the multi-sublayered first buffer layers and the substrate. The non-sublayered second buffer layers of the first multilayered buffer subregion are each thicker than each first and each second buffer sublayer of each multi-sublayered first buffer layer of the first multilayered buffer subregion. The first multilayered buffer subregion of the buffer region is less in mean lattice constants than the main semiconductor region.

Formed on the first multilayered buffer subregion of the foregoing make, the second multilayered buffer subregion of the buffer region comprises alternations of a first and a second buffer layer. The first buffer layers of the second multilayered buffer subregion are each thinner than each non-sublayered second buffer layer of the first buffer subregion and less in lattice constants than the substrate. The second buffer layers of the second multilayered buffer subregion are each thinner than each non-sublayered second buffer layer of the first buffer subregion and intermediate in lattice constants between the first buffer layers of the second multilayered buffer subregion and the substrate. The second multilayered buffer subregion of the buffer region is intermediate in mean lattice constants between the first multilayered buffer subregion of the buffer region and the main semiconductor region.

The semiconductor wafer of the above new and improved configuration according to the invention brings about the following benefits:

1. The buffer region is divided into the first and the second multilayered buffer subregion, with the second subregion made higher in mean lattice constants than the first. Not only is the wafer thus saved from warping, but, as additional but no less significant advantages, both buffer region and main semiconductor region can be made as thick as necessary for the wafer to achieve a desired degree of antivoltage strength in its thickness direction.
2. The second multilayered buffer subregion coacts with the first multilayered buffer subregion to provide a required degree of tensile stress for counterbalancing the compressive stress to which is subjected the main semiconductor region. The total tensile stress offered by the buffer region is easy of fine adjustment by the number of alternations of the constituent layers of the second multilayered buffer subregion. The warpage of the wafer is reducible to an absolute minimum by thus counteracting the compressive stress of the main semiconductor region with the matching tensile stress of the buffer region.
3. Being higher in mean lattice constants than the first multilayered buffer subregion, the second multilayered buffer subregion is subject to a less tensile strength than the first. Consequently, the wafer becomes gradually less warped with an increase in its thickness as the first and then the second multilayered buffer subregion are formed during the progress of wafer fabrication. The maximum warping of the wafer during its fabrication, which comes about at the time of the completion of the growth of the second buffer subregion (and before the creation of the main semiconductor region thereon), is therefore less than that of the prior art having no equivalence to the second multilayered buffer subregion. The result is a diminution of dislocations in the main semiconductor region formed subsequently on this second multilayered buffer subregion. Moreover, in mass production of the wafers based upon the principles of this invention, their warpage, if any, will less fluctuate than heretofore.
4. The second multilayered buffer subregion also makes it possible to make the main semiconductor region thicker for higher antivoltage strength.
5. The second multilayered buffer subregion also serves to reduce fluctuations in warpage at a desired wafer thickness.
6. Having the first sublayers of relatively low lattice constants, the multi-sublayered first buffer layers of the first multilayered buffer subregion generate, macroscopically, tensile stresses (expansive strains). The non-sublayered second buffer layers of the first multilayered buffer subregion, which alternate with the multi-sublayered first buffer layers, are higher in lattice constants than the first sublayers of the first buffer layers of the first multilayered buffer subregion and so give rise to compressive stresses (compressive strains). These compressive stresses cancel, up to a certain limit, the tensile stresses of the multi-sublayered first buffer layers of the first multilayered buffer subregion. Thus the first multilayered buffer subregion may be made as thick as required without inconveniently increasing its overall tensile stress.
7. The first multilayered buffer subregion permits fine stress adjustment thanks to the presence of the non-sublayered second buffer layers therein.
8. The buffer region of the wafer is divided into the first and the second multilayered buffer subregion. The first multilayered buffer subregion is a lamination of the alternating first and second buffer layers, each first buffer layer being itself a lamination of the extremely thin, alternating first and second buffer sublayers. The second multilayered buffer subregion is also a lamination of the extremely thin, alternating first and second buffer layers. The buffer region of such multilayered, multi-sublayered configuration is more immune to cracks, and permits itself to be grown to a greater thickness, than its conventional counterparts.

The above and other objects, features and advantages of this invention will become more apparent, and the invention itself will best be understood, from a study of the following description and appended claims, with reference had to the attached drawings showing some preferable embodiments of the invention.

BRIEF DESCRIPTION OF THE DRAWINGS

FIG. 1 is a schematic diagram of a semiconductor wafer to which the present invention finds application.

FIG. 5 is a diagram explanatory of how the wafer according to the invention is prevented from warping by stresses generated in its two buffer subregions and main semiconductor region.

DETAILED DESCRIPTION

Figure 2:
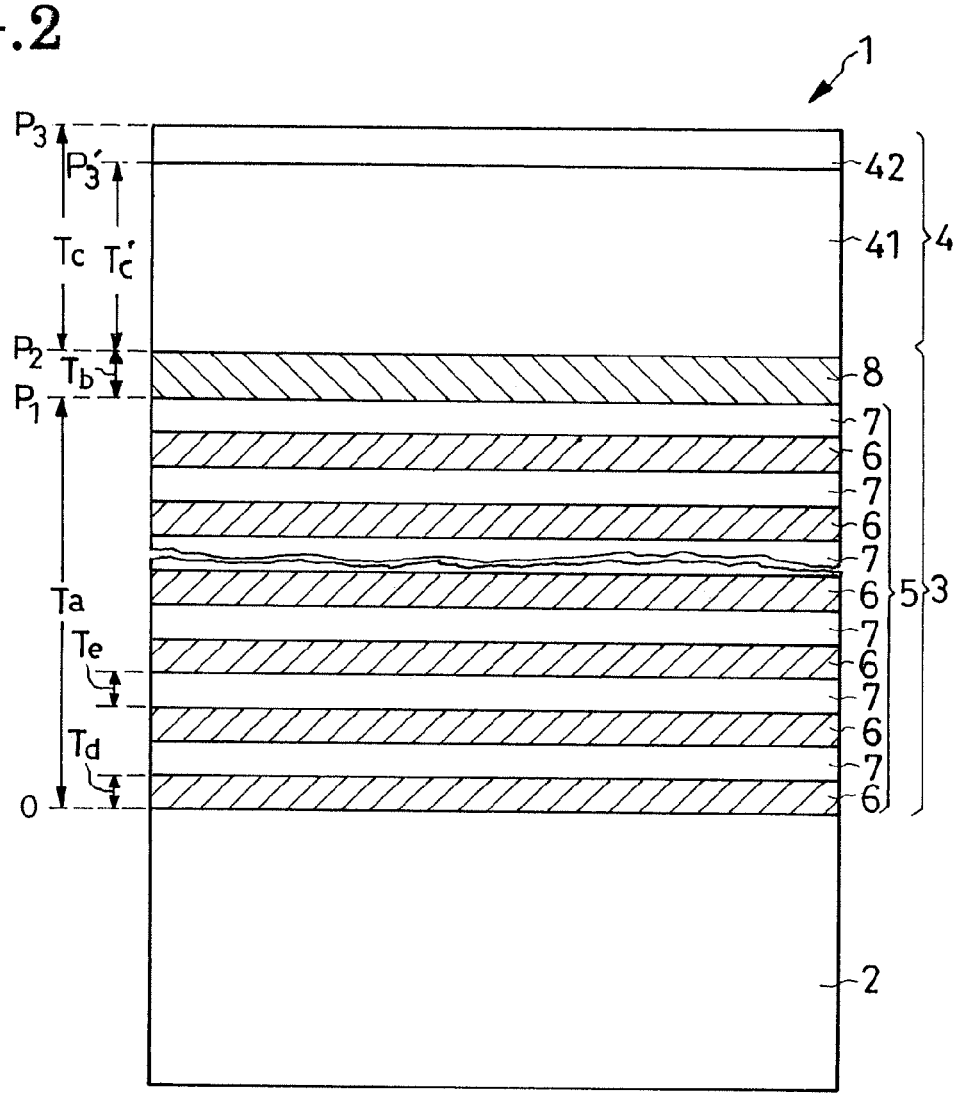
FIG. 2 is a greatly enlarged, partly broken away, schematic sectional illustration of the wafer of FIG. 1, showing the wafer as configured for fabrication of HEMTs according to the novel concepts of this invention.

The present invention will now be described more specifically as applied to a wafer for fabrication of HEMTs. Such a wafer is drawn schematically in FIG. 1 and therein generally labeled 1. Broadly, the wafer 1 is a lamination of a semiconducting silicon substrate 2, a buffer region 3 of semiconducting nitride materials on the substrate, and a main semiconductor region 4 of semiconducting nitride materials on the buffer region for providing matrices of HEMTs.

The substrate 2 of the wafer 1 is of monocrystalline silicon having a lattice constant (e.g., 0.543 nm) greater than those of the buffer region 3 and main semiconductor region 4 and a coefficient of linear thermal expansion (e.g., $4.70 \times 10^{-6}$/K) less than that (e.g., $5.60 \times 10^{-6}$/K) of the buffer region 3 and that (e.g. $5.59 \times 10^{-6}$/K) of the main semiconductor region 4. The thickness of the substrate 2 may be about 350-1200 μm. The substrate 2 is intended to serve both as a basis for growing thereon the buffer region 3 and main semiconductor region 4, and as a mechanical support therefor and for an auxiliary electrode, not shown in FIG. 1, to be formed on the back of the substrate for stabilization of the performance of the devices. As required, the silicon substrate 2 may be doped with a conductivity type determinant such as boron or like Group III elements or phosphorus or like Group V elements. It is also possible to make this substrate from silicon carbide or other silicon compounds.

Figure 3:
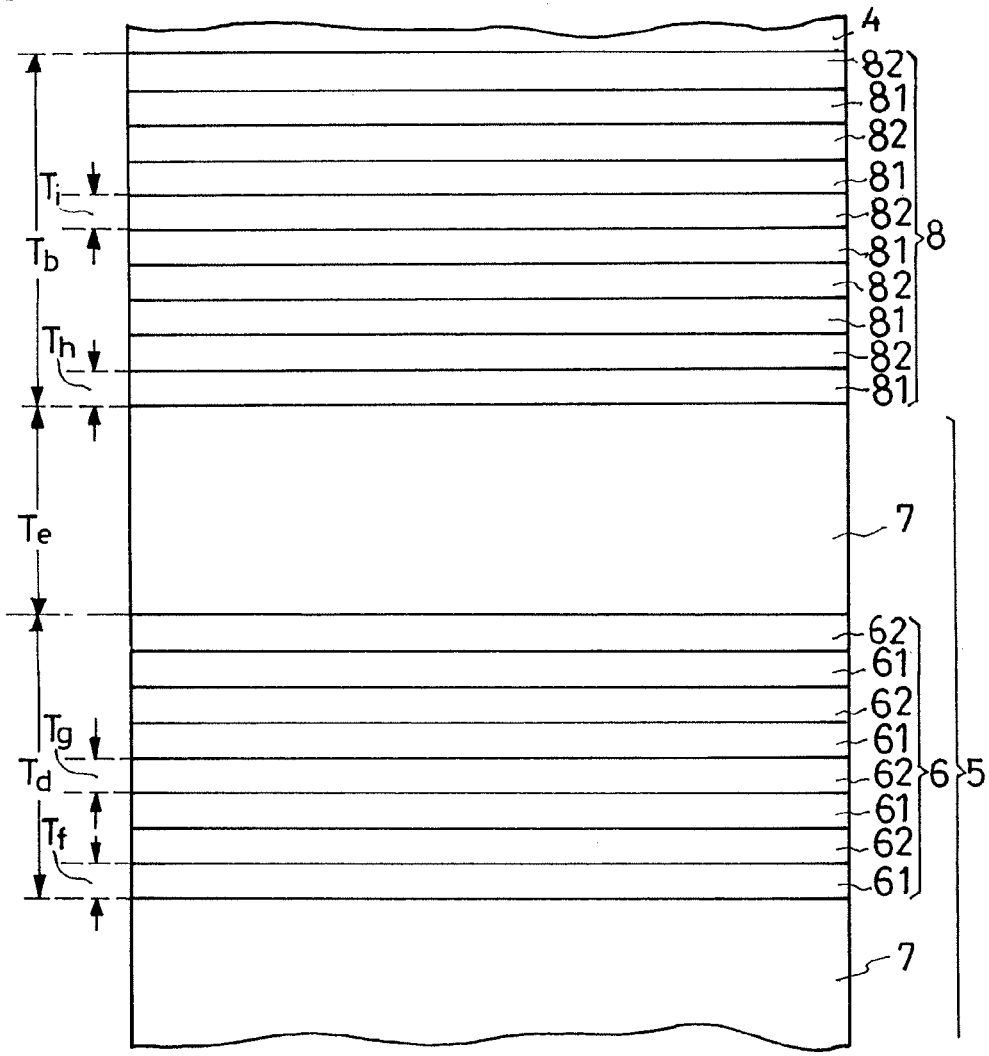
FIG. 3 is a still more enlarged, fragmentary, schematic sectional illustration showing part of the buffer region of the wafer of FIG. 2 in more detail.

The reader's attention is briefly invited to FIGS. 2 and 3 before proceeding further with the explanation of the wafer 1. FIG. 2 is a greatly enlarged, partly broken away illustration of the wafer 1, showing the buffer region 3 and main semiconductor region 4 in more detail. FIG. 3 is a still more enlarged, fragmentary illustration of the wafer 1, showing part of the buffer region 3 in still more detail. It is to be understood that the relative thicknesses of the substrate 2, buffer region 3 and main semiconductor region 4 indicated in FIGS. 1 and 2 are by way of illustration only and do not in any way represent their actual or desired dimensions. Nor do the relative thicknesses of the constituent layers and sublayers of the buffer region 3 in FIGS. 2 and 3.

With particular reference to FIG. 2, the buffer region 3 of the wafer 1 comprises a first multilayered buffer subregion 5 of thickness $T_a$ and a second multilayered buffer subregion 8 of smaller thickness $T_b$. As will be understood by referring also to FIG. 3, the first buffer subregion 5 of the buffer region 3 is a lamination of alternating two different kinds of layers, namely, multi-sublayered first buffer layers 6 and non-sublayered second buffer layers 7. Although shown partly broken away in FIG. 2, the first buffer subregion 5 may be constituted of eight first buffer layers 6 and as many second buffer layers 7 for the best results. Speaking broadly, however, the first buffer subregion 5 may comprise from about four to about fifty pairs of first buffer layers 6 and second buffer layers 7. Experiment has proved that, with the number of pairs of first and second buffer layers 6 and 7 outside that range, the resulting devices indicate little or no improvement in wafer warpage reduction and crystallinity.

The first buffer layers 6 of the first buffer subregion 5 need not be of the same thickness $T_d$ as in FIG. 2, or of the same composition, from one to another. They may differ in thickness and/or composition as long as such differences do not run counter to the stated objectives of this invention. The same holds true with the second buffer layers 7 of the first buffer subregion 5. They may also differ in thicknesses $T_e$ and/or composition from one to another as long as such differences serve the purposes of the invention.

FIG. 3 indicates that each first buffer layer 6 of the first buffer subregion 5 is a lamination of a prescribed number of alternations of first and second buffer sublayers 61 and 62, although the first buffer layers 6 could take the form of superlattices suggested by the prior art cited earlier herein. The illustrated four alternations of first and second buffer sublayers 61 and 62 of each first buffer layer 6 are by way of example only; in practice, there may be employed from about four up to as many as fifty or so such alternations for each first buffer layer. The thickness $T_d$ of each complete first buffer layer 6 may be about 5-1000 nm, preferably about 20-400 nm.

The first buffer sublayers 61 of the first buffer layers 6 of the first buffer subregion 5 are all made from an aluminum-containing nitride semiconductor selected from among the semiconducting compounds that are generally defined as:

where M is at least either of indium and boron; the subscript x is a numeral that is greater than zero and equal to or less than one; the subscript y is a numeral that is equal to or greater than zero and less than one; and the sum of x and y is equal to or less than one. Specific examples meeting this formula are aluminum nitride (AlN), aluminum indium nitride (AlInN), aluminum gallium nitride (AlGaN), and aluminum indium gallium nitride (AlInGaN).

The thickness $T_f$ of each first sublayer 61 of the first buffer layers 6 may be about 1-20 nm. Made thinner than about one nanometer or thicker than about twenty nanometers, the first sublayers 61 would not conduce to the reduction of wafer warpage or to the improvement of the crystallinity of the main semiconductor region 4. The first sublayers 61 are all made from AlN to a thickness of five nanometers in this particular embodiment. However, broadly speaking, the first sublayers 61 of the first buffer layers 6 need not be all of the same material or, despite the showing of FIG. 3, of the same thickness but may differ in composition or thickness or both.

Made from AlN, the first sublayers 61 of the first buffer layers 6 have lattice constants a and c of, say, 0.311 nm and 0.498 nm, respectively, which are less than those of the silicon substrate 2. The first sublayers 61 have a linear expansion coefficient of, say, $5.64 \times 10^{-6}$/K, which is greater than that of the substrate 2. As required or desired, the first sublayers 61 may be doped with either an n- or p-type conductivity determinant.

The second buffer sublayers 62 of the first buffer layers 6 of the first buffer subregion 5 are all made from a nitride semiconductor that differs from that of the first buffer sublayers 61 in its aluminum content. The nitride semiconductors adoptable for the second buffer sublayers 62 are generally expressed by the formula:

where M is at least either of indium and boron; the subscript a is a numeral that is equal to or greater than zero and equal to or less than one and, additionally, less than x in the formula above defining the materials for the first buffer sublayers 61; the subscript b is also a numeral that is equal to or greater than zero and less than one; and the sum of a and b is equal to or less than one.

Thus the second buffer sublayers 62 of the first buffer layers 6 can be made from such compounds as GaN, InGaN, AlInN, AlGaN, and AlInGaN. As is apparent from the formula above, the nitride semiconductors for the second buffer sublayers 62 either do not contain aluminum or do contain it in a proportion less than that of the first buffer sublayers 61 of the first buffer layers.

The thickness $T_g$ of each second buffer sublayer 62 of the first buffer layers 6 may be about 1-10 nm, preferably about 3-7 nm. Formed to a thickness outside that range, the second buffer sublayers 62 would fail to lessen wafer warpage or to improve the crystallinity of the main semiconductor region 4. The second buffer sublayers 62 are made from GaN to a thickness of 3.5 nm in this particular embodiment. Preferably, the thickness $T_g$ of each second buffer sublayers 62 may be made less than the thickness $T_f$ of each first buffer sublayer

61. Also, optionally, both first and second sublayers 61 and 62 may take the form of superlattices.

It is unessential that all the second buffer sublayers 62 of the first buffer layers 6 be made from the same material or, despite the showing of FIG. 3, to the same thickness. They may indeed be made from different materials and/or to different thicknesses as long as such differences do not hamper the objectives of this invention.

Made from GaN, or other nitrides that do not contain aluminum or that do contain aluminum in a less proportion than do the first buffer sublayers 61, the second sublayers 62 of the first buffer layers 6 have lattice constants a and c of, say, 0.318 nm and 0.518 nm, respectively, which are greater than those of the first buffer sublayers 61 and less than those of the substrate 2. The second sublayers 62 have a linear expansion coefficient of, say, $5.59 \times 10^{-6}$/K, which is greater than that of the substrate 2. Optionally, the second sublayers 62 may also be doped with either an n- or p-type conductivity determinant.

The non-sublayered second buffer layers 7 of the first buffer subregion 5 of the buffer region 3 are all made from a nitride semiconductor that does not contain aluminum or that does contain it in a prescribed range of proportions. The nitride semiconductors adoptable for the second buffer layers 7 are generally defined as:

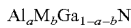

$$Al_a M_b Ga_{1-a-b} N$$

where M is at least either of indium and boron; the subscript a is a numeral that is equal to or greater than zero and equal to or less than one and, additionally, less than x in the formula above defining the materials for the first buffer sublayers 61 of the first buffer layers 6; the subscript b is a numeral that is equal to or greater than zero and less than one; and the sum of a and b is equal to or less than one.

The aluminum content, if any, of the above defined nitride semiconductors for the second buffer layers 7 of the first buffer subregion 5 is less than that of the first buffer sublayers 61 of the first buffer layers 6 and, moreover, less than the mean (or macroscopic, as will be defined later) aluminum content of the multi-sublayered first buffer layers 6.

Since the non-sublayered second buffer layers 7 of the first buffer subregion 5 are less in aluminum content than the first buffer sublayers 61 of the first buffer layers 6, the lattice constants a and c of these second buffer layers 7 are greater than those of the first buffer sublayers 61 and the mean or macroscopic lattice constants of the multi-sublayered first buffer layers 6 and less than the lattice constants of the substrate 2. If made from GaN, for instance, the second buffer layers 7 have lattice constants a and c of 0.318 nm and 0.518 nm, respectively. The second buffer layers 7 have a linear expansion coefficient of, say, $5.59 \times 10^{-6}$/K, which is higher than that of the substrate 2. The second buffer layers 7 may be doped with an n- or p-type conductivity determinant.

It is desired from the standpoint of simplification of the manufacturing process that the second buffer layers 7 of the first buffer subregion 5 be made from the same material (e.g., GaN) as the second buffer sublayers 62 of the first buffer layers 6. In this case each second buffer layer 7 will be formed as a virtual extension of the topmost second buffer sublayer 62 of the underlying first buffer layer 6. No boundary will then exist between the topmost second sublayer 62 of each first buffer layer 6 and the overlying second buffer layers 7, and the topmost second sublayer 62 will form part of the second buffer layer 7. The number of the first buffer sublayers 61 of each first buffer layer 6 will then be one more than that of the remaining second buffer sublayers 62 of each first buffer layer.

The thickness $T_e$ of each second buffer layer 7 of the first buffer subregion 5 should be greater than the thickness $T_g$ of each second buffer sublayer 62 of the first buffer layers 6 of the first buffer subregion 5. Normally, the thickness $T_e$ of each second buffer layer 7 should be about 20-400 nm, preferably about 100-400 nm. Should the second buffer layers 7 be made thinner than about 20 nm or thicker than about 400 nm, the resulting wafer might not be as free from warpage, or as good in crystallinity of the main semiconductor region 4, as desired. The second buffer layers 7 are made from GaN each to a thickness of 200 nm in this embodiment.

The second buffer layers 7 of the first buffer subregion 5 need not necessarily be all made from the same material or to the same thickness. They may differ in material or thickness or both as long as such differences do not adversely affect the accomplishment of the purposes of this invention.

With continued reference to FIGS. 2 and 3 the second multilayered buffer subregion 8 of the buffer region 3 comprises multiple alternations of two different kinds of layers 81 and 82 for mitigating the stresses exerted on the overlying main semiconductor region 4. The second multilayered buffer subregion 8 has a mean or macroscopic aluminum content that is less than that of the first multilayered buffer subregion 5 and that is intermediate those of the main semiconductor region 4 and the first multilayered buffer subregion 5. Further the mean or macroscopic lattice constants of the second multilayered buffer subregion 8 are greater than those of the first multilayered buffer subregion 5 and intermediate those of the main semiconductor region 4 and the first multilayered buffer subregion 5.

By the term "mean or macroscopic aluminum content" of the second multilayered buffer subregion 8 as used above is meant the ratio of the total weight of aluminum contained in the second buffer subregion 8 to the total weight of that subregion 8. The "mean or macroscopic aluminum content" of the first multilayered buffer subregion 5 likewise means the ratio of the total weight of aluminum contained in the first buffer subregion 5 to the total weight of that subregion 5.

Also, the "mean or macroscopic lattice constants" of the second multilayered buffer subregion 8 mean the quotient of the division by the total thickness $T_b$ of the second buffer subregion 8, of the sum $[m(C_3 \times T_h) + n(C_4 \times T_i)]$ of the products $(C_3 \times T_h)$ and $(C_4 \times T_i)$, where:

m=number of the first layers 81 of the second multilayered buffer subregion 8;

n=number of the second layers 82 of the second multilayered buffer subregion 8;

$C_3$=lattice constants of each first layer 81 of the second multilayered buffer subregion 8;

$C_4$=lattice constants of each second layer 82 of the second multilayered buffer subregion 8;

$T_h$=thickness of each first layer 81 of the second multilayered buffer subregion 8;

$T_i$=thickness of each second layer 82 of the second multilayered buffer subregion 8.

Further the "mean or macroscopic lattice constants" of the first multilayered buffer subregion 5 mean the quotient of the division by the total thickness $T_a$ of the first buffer subregion 5, of the sum $[a(C_1 \times T_f) + b(C_2 \times T_g) + c(C_5 \times T_e)]$ of the products $(C_1 \times T_f)$, $(C_2 \times T_g)$ and $(C_5 \times T_e)$, where:

a=number of the first sublayers 61 of the first layers 6 of the first multilayered buffer subregion 5;

b=number of the second sublayers 62 of the first layers 6 of the first multilayered buffer subregion 5;

c=number of the non-sublayered second layers 7 of the first multilayered buffer subregion 5;

$C_1$=lattice constants of each first sublayer 61 of the first layers 6 of the first multilayered buffer subregion 5;

$C_2$=lattice constants of each second sublayer 62 of the first layers 6 of the first multilayered buffer subregion 5;

$C_5$=lattice constants of each non-sublayered second layer 7 of the first multilayered buffer subregion 5;

$T_f$=thickness of each first sublayer 61 of the first layers 6 of the first multilayered buffer subregion 5;

$T_g$=thickness of each second sublayer 62 of the first layers 6 of the first multilayered buffer subregion 5.

$T_e$=thickness of each non-sublayered second layer 7 of the first multilayered buffer subregion 5.

Definitions of the "mean or macroscopic aluminum content" and "mean or macroscopic lattice constants" of the main semiconductor region 4, which region is yet to be discussed in detail, are considered self-evident from the foregoing definitions of these terms as applied to the multilayered buffer subregions 5 and 8.

Typically, the second multilayered buffer subregion 8 has twenty pairs of layers 81 and 82, although only five such pairs are shown in FIG. 3 for illustrative convenience. Broadly, the pairs of layers 81 and 82 may be employed in any number ranging from about three to about fifty. Outside this range, the second multilayered buffer subregion 8 would not contribute toward reduction of wafer warpage or improvement of the crystallinity of the main semiconductor region 4. The thickness of the multilayered buffer subregion 8 may be about 5-1000 nm, preferably 20-400 nm. This subregion 8 might be reconfigured as a superlattice buffer.

The first constituent layers 81 of the second multilayered buffer subregion 8 may be made from any of the aluminum-containing nitride semiconductors of the general formula:

$$Al_{x'}M_{y'}Ga_{1-x'-y'}N$$

where M is at least either of indium and boron; the subscript x' is a numeral that is greater than zero, equal to or less than one, and equal to or less than x in the formula above defining the possible materials for the first buffer sublayers 61 of the first buffer layers 6 of the first buffer subregion 5; the subscript y' is a numeral that is equal to or greater than zero and less than one; and the sum of x' and y' is equal to or less than one. Specific examples meeting this formula are AlN, AlInN, AlGaN, and AlInGaN.

As set forth above, the aluminum proportion x' of the first buffer layers 81 of the second multilayered buffer subregion 8 may be equal to the aluminum proportion x of the first buffer sublayers 61 of the first buffer layers 6. However, also as has been already explained, the second multilayered buffer subregion 8 must be so formed that its mean or macroscopic aluminum content is less than that of the first multilayered buffer subregion 5 and that its mean or macroscopic lattice constants are greater than those of the first multilayered buffer subregion 5. Therefore, the second multilayered buffer subregion 8 must be so formed that its mean or macroscopic aluminum content is less than that of the multi-sublayered first buffer layers 6 of the first buffer subregion 5 and that its mean or macroscopic lattice constants are greater than those of the multi-sublayered first buffer layers 6. Possibly, the aluminum proportion of the first layers 81 of the second multilayered buffer subregion 8 may be equal to that of the first sublayers 61 of the multi-sublayered first buffer layers 6 of the first buffer subregion 5, while the ratio $(m \times T_h/T_b)$ of the sum of the thicknesses $T_h$ of all the first layers 81 of the second multilayered buffer subregion 8 to the thickness $T_b$ of this buffer subregion 8 is less than the ratio $(a \times T_f/T_d)$ of the sum of the thicknesses $T_f$ of all the first sublayers 61 of each first buffer layer 6 of the first buffer subregion 5 to the thickness $T_d$ of each first buffer layer 6. In this case the second multilayered buffer subregion 8 is less in mean aluminum content than the multi-sublayered first buffer layers 6 of the first buffer subregion 5.

The thickness $T_h$ of each first layer 81 of the second buffer subregion 8 is desired to be less than the thickness $T_e$ of each non-sublayered second layer 7 of the first buffer subregion 5 and is normally in the range of about 1-20 nm. The first layers 81 of the second buffer subregion 8 are made from AlN each to a thickness of five nanometers in this embodiment.

The first layers 81 of the second buffer subregion 8 need not necessarily be all made from the same material or, contrary to the showing of FIG. 3, to the same thickness $T_h$. They may differ in material or thickness or both as long as such differences do not impair the accomplishment of the purposes of this invention. Also, as required, these layers 81 may be doped with an either n- or p-type conductivity determinant.

The second layers 82 of the second multilayered buffer subregion 8 may be made from any of the nitride semiconductors of the general formula:

$$Al_{a'}M_{b'}Ga_{1-a'-b'}N$$

where M is at least either of indium and boron; the subscript a' is a numeral that is equal to or greater than zero, equal to or less than one, and less than x' in the formula above defining the possible materials for the first layers 81 of the second buffer subregion 8; the subscript b' is a numeral that is equal to or greater than zero and less than one; and the sum of a' and b' is equal to or less than one. Specific examples meeting this formula are GaN, InGaN, AlInN, AlGaN, and AlInGaN.

Thus the second layers 82 of the second multilayered buffer subregion 8 may either contain, or not contain, aluminum. Moreover, in cases where they contain aluminum, its proportion should be less than that of the first layers 81 of the second buffer subregion 8. It is desirable that the proportion of the aluminum content, if any, of the second layers 82 of the second buffer subregion 8 be equal to or less than the aluminum proportion of the second sublayers 62 of the first layers 6 of the first multilayered buffer subregion 5.

Because the second layers 82 of the second multilayered buffer subregion 8 either do not contain aluminum or do contain it in a proportion less than the aluminum proportion of the first layers 81 of the second buffer subregion 8, the lattice constants a and c of these layers 82 are greater than those of the first layers 81 of the second buffer subregion 8 and less than those of the substrate 2. Made from GaN, the second layers 82 of the second buffer subregion 8 have lattice constants a and c of 0.318 nm and 0.518 nm, respectively. The mean or macroscopic lattice constants of this second multilayered buffer subregion 8 are closer to those of the main semiconductor region 4 than are the first multilayered buffer subregion 5.

The second layers 82 of the second multilayered buffer subregion 8 have a linear expansion coefficient (e.g., $5.59 \times 10^{-6}$/K) higher than that of the substrate 2.

The thickness $T_i$ of each second layer 82 of the second multilayered buffer subregion 8 is desired to be less than the thickness $T_e$ of each non-sublayered second layer 7 of the first buffer subregion 5. A range of about 1-50 nm is currently recommended for this thickness $T_i$. It is also desired that the thickness $T_i$ of each second layer 82 of the second buffer subregion 8 be greater than the thickness $T_g$ of each second sublayer 62 of the first layers 6 of the first buffer subregion 5.

The second buffer subregion 8 will then be so formed that, as suggested by this invention, its mean or macroscopic aluminum content is less than that of the first buffer subregion 5 while its mean or macroscopic lattice constants are greater than those of the first buffer subregion 5.

It is desired that both first and second layers 81 and 82 of the second buffer subregion 8 be configured to provide a superlattice. The second layers 82 of the second buffer subregion 8 need not necessarily be all made from the same material or, contrary to the showing of FIG. 3, to the same thickness $T_i$. Here again, they may differ in material or thickness or both as long as such differences do not counter the purposes of this invention. Also, as required, these layers 82 may be doped with an either n- or p-type conductivity determinant.

Figure 4:
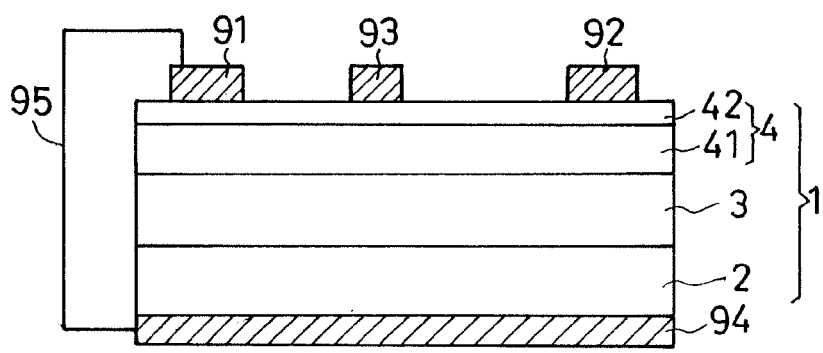
FIG. 4 is a schematic diagram of a HEMT made from the wafer of FIGS. 1-3.

Referring now to FIG. 4, the wafer 1 of this embodiment has its main semiconductor region 4 constituted of an electron transit layer 41 of undoped GaN and, thereon, an electron supply layer 42 of undoped $Al_{0.2}Ga_{0.8}N$, for providing HEMTs. As required, the electron supply layer 42 may be doped with n-type impurities. The aluminum content of the electron supply layer 42 is variable arbitrarily. Grown to a thickness of 1800 nm on the buffer region 3, the electron transit layer provides the channel for each HEMT.

In this particular embodiment the second layers 82 of the second buffer subregion 8 are made from GaN, and so is the electron transit layer 41 of the main semiconductor region 4. There is therefore no boundary between the topmost second layer 82 of the second buffer subregion 8 and the electron transit layer 41 of the main semiconductor region 4. The topmost second layer 82 of the second buffer subregion 8 might indeed be considered part of the electron transit layer 41, in which case the second layers 82 of the second buffer subregion 8 would be one less in number than the first layers 81 of that subregion 8.

Overlying the electron transit layer 41, the electron supply layer 42 coacts therewith to create a known two-dimensional electron gas layer in the neighborhood of their interface by virtue of piezoelectric depolarization due to the heterojunction of these layers 41 and 42. The electron supply layer 42 may be 30 nm thick.

The aluminum-containing electron supply layer 42 is so thin compared to the aluminum-free electron transit layer 41 that the mean aluminum proportion of the main semiconductor region 4 is roughly the same as that of the electron transit layer 41 and less than that of the first multilayered buffer subregion 5 of the buffer region 3. The mean lattice constants of the main semiconductor region 4 are approximately the same as those of the electron transit layer 41, greater than those of the first multilayered buffer subregion 5 of the buffer region 3 and less than those of the substrate 2.

In the practice of this invention the main semiconductor region 4 may be made from a variety of semiconducting compounds other than GaN and AlGaN, although nitrides are generally preferred. It is recommended, moreover, that the main semiconductor region 4 be less in mean aluminum content, and greater in lattice constants, than the two subregions 5 and 8 of the buffer region 3. These requirements are met in the main semiconductor region 4 of the FIG. 2 configuration in which the GaN electron transit layer 41 is much thicker than the AlGaN electron supply layer 42.

The wafer 1 is shown electroded in FIG. 4 for use as a HEMT. The electrodes include a source 91, drain 92, and gate 93. The source 91 and drain 92 are both in ohmic contact, and the gate 93 in Schottky contact, with the electron supply layer 42. Optional contacts of high n-type impurity concentration might be interposed between the source 91 and drain 92 and the electron supply layer 42. Additionally, an auxiliary or back electrode 94 is formed on the underside of the substrate 2 and electrically coupled to the source 91 via a conductor 95 for stabilizing the performance of the HEMT. What counts in the HEMT of this electrode arrangement is the antivoltage strength between the drain 92 and the auxiliary electrode 94. The silicon substrate 2 is not much reliable for attainment of a desired degree of antivoltage strength, so that the buffer region 3 and main semiconductor region 4 may be made sufficiently thick for that purpose.

Method of Fabrication

The fabrication of the semiconductor wafer 1, constructed as above described with reference to FIGS. 1-4, starts with the preparation of the silicon substrate 2 having a major surface of crystal orientation (111) in terms of Miller indices. Introduced into a metal organic chemical vapor deposition (MOCVD) reactor, the silicon substrate may have its major surface bared by stripping off the oxide film.

For making the lowermost multi-sublayered first buffer layer 6 of the first buffer subregion 5 of the buffer region 3 on this substrate 2, the first and second sublayers 61 and 62 may be alternately grown in the MOCVD reactor. If the first sublayers 61 are to be made from AlN, and the second sublayers 62 from GaN, then trimethyl aluminum (TMA) and ammonia may be charged in required proportions into the reactor until an AlN layer (first buffer sublayer 61) is grown to a required thickness on the substrate. Then, with the introduction of TMA suspended, trimethyl gallium (TMG) and $NH_3$ may be charged in required proportions into the reactor until a GaN layer (second buffer sublayer 62) is grown to a required thickness on the preformed AlN layer. The alternate production of the two buffer sublayers 61 and 62 may be repeated a required number of times until the lowermost first buffer layer 6 of the first buffer subregion 5 is completed.

Then the lowermost non-sublayered second buffer layer 7 of the first buffer subregion 5 is created on the lowermost multi-sublayered first buffer layer 6. Both $NH_3$ and TMG may be introduced into the reactor for fabricating the second buffer layer 7 of GaN.

The fabrication of one multi-sublayered first buffer layer 6 and non-sublayered second buffer layer 7 may be repeated cyclically a required number of times by the same methods as above. Thus will be completed the first buffer subregion 5 of the buffer region 3.

The next step is the fabrication of the multilayered second buffer subregion 8 of the buffer region 3. The alternating two different layers 81 and 82 of this second buffer subregion 8 may be made by alternating charging $NH_3$ and TMA, and $NH_3$ and TMG into the reactor.

The first layers 81 of the second buffer subregion 8 and the first sublayers 61 of the first layers 6 of the first buffer subregion 5 are both made from AlN to the same thickness of five nanometers. However, since the second layers 82 of the second buffer subregion 8 are thicker than the second sublayers 62 of the first layers 6 of the first buffer subregion 5, the mean or macroscopic aluminum content of the second buffer subregion 8 is less than that of the first buffer subregion 5.

Next comes the step of fabricating the main semiconductor region 4 on the second buffer subregion 3. Both electron transit layer 41 and electron supply layer 42 may be made by the known method of epitaxy. The production of the wafer 1 is now completed.

FIG. 5 diagrammatically illustrates stresses (strains) generated in the first multilayered buffer subregion 5, second multilayered buffer subregion 8, and main semiconductor region 4 of the wafer 1. Comprised of the alternating multi-sublayered first layers 6 and non-sublayered second layers 7, the first buffer subregion 5 is higher in mean aluminum content, and less in mean lattice constants, than the main semiconductor region 4. Thus, as indicated by the pair of arrows shown oriented away from each other in FIG. 5, the first buffer subregion 5 is subjected to a tensile (expansive) stress.

The second buffer subregion 8 is a lamination of alternations of the first layer 81 which contains aluminum and the second layer 82 which either does not contain aluminum or does contain it in a less proportion than does the first layer 81. This second buffer subregion 8 has a mean aluminum content that is greater than that of the main semiconductor region 4 and less than that of the first buffer subregion 5, and mean lattice constants that are less than those of the main semiconductor region 4 and greater than those of the first buffer subregion 5. Consequently, also as indicated by the pair of outwardly oriented arrows in FIG. 5, the second buffer subregion 8 experiences a tensile (expansive) stress. However, the second buffer subregion 8 is less in mean aluminum content than the first buffer subregion 5, so that the tensile (expansive) stress of the second buffer subregion 8 is less than that of the first buffer subregion 5.

In contrast, being higher in mean lattice constants than the two buffer subregions 5 and 8, the main semiconductor region 4 is subjected to a compressive stress, as indicated by the pair of arrows shown directed toward each other in FIG. 5. The tensile stresses of the two buffer subregions 5 and 8 combine to counterbalance the compressive stress of the main semiconductor region 4. The tensile stress of the second buffer subregion 8 is adjustable by varying the number of alternations of its constituent layers 81 and 82 in order to strike an optimal balance between the compressive stress of the main semiconductor region 4 and the combined tensile stress of the whole buffer region 3. The warpage of the wafer 1 can thus be reduced to an absolute minimum.

Figure 6:
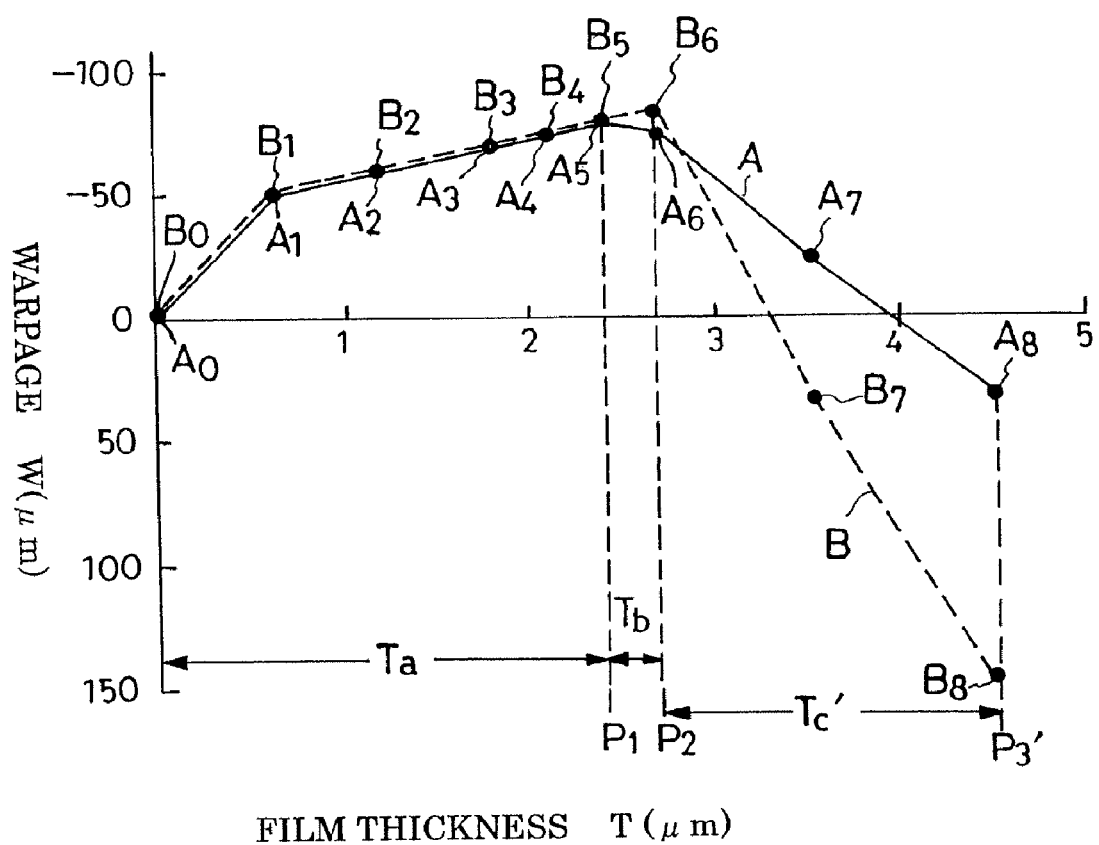
FIG. 6 is a graph explanatory of how the warping of the wafer is controlled during the fabrication of the buffer subregions and main semiconductor region.

FIG. 6 is a graph in which the horizontal axis represents the thickness T in micrometers of the semiconducting nitride film being grown on the silicon substrate 2 to create the buffer region 4 and main semiconductor region 4, with zero on the substrate surface. The vertical axis of the graph represents the macroscopic warpage W of the wafer during its fabrication. The negative values of this vertical axis, above the horizontal axis, indicate the degrees to which the wafer is warped concavely as seen from above, and its positive values the degrees to which the wafer is warped convexly.

The solid line curve A in FIG. 6 plots the macroscopic wafer warpage W against the nitride film thickness T in the course of the successive fabrication of the first buffer subregion 5 and second buffer subregion 8 of the buffer region 3 and the GaN electron transit layer 41 of the main semiconductor region 4, all according to the invention. The broken line curve in the same graph plots similar macroscopic wafer warpage W during the fabrication of a prior art wafer which is not equipped with the second buffer subregion 8 of this invention.

The silicon substrates, and of course wafers, used for the warpage measurements were 125 mm across, and the substrates were 700 μm thick. The film thickness T is zero at the origin of the graph where both inventive and prior art wafers have no warpage W, as indicated respectively by the indicia $A_0$ and $B_0$. The first sublayers 61 of the first layers 6 of the first subregion 5, and the first layers 81 of the second subregion 8, of the buffer region 3 were both of AlN. The second sublayers 62 of the first layers 6 of the first buffer subregion 5, the second layers 7 of the first buffer subregion 5, the second layers 82 of the second buffer subregion 8, and the electron transit layer 41 of the main semiconductor region 4 were all of GaN.

The nitride film thickness T and warpage W of the wafer according to the invention had the values tabulated below at points $A_1$-$A_8$ on the solid line curve in FIG. 6.

|  | Film Thickness T (μm) | Wafer Warpage W (μm) |
| --- | --- | --- |
| Point $A_1$ | 0.62 | −50 |
| Point $A_2$ | 1.22 | −60 |
| Point $A_3$ | 1.82 | −70 |
| Point $A_4$ | 2.12 | −75 |
| Point $A_5$ | 2.42 | −80 |
| Point $A_6$ | 2.72 | −76 |
| Point $A_7$ | 3.52 | −25 |
| Point $A_8$ | 4.52 | +30 |

The points $A_5$, $A_6$ and $A_8$ of the curve A of the graph in FIG. 6 correspond respectively to the heights or thicknesses $P_1$, $P_2$ and $P_3'$, FIG. 2, of the nitride film being grown on the substrate 2. It is thus seen that the curve A represents at its point $A_5$ the wafer warpage when only the first multilayered subregion 5 of the buffer region 3 is formed on the substrate 2, at its point $A_6$ the wafer warpage when both first multilayered subregion 5 and second multilayered subregion 8 of the buffer region 3 are formed on the substrate 2, and at its point $A_8$ the wafer warpage when the buffer region 3 and the electron transit layer 41 are all formed on the substrate 2. The electron supply layer 42 of the main semiconductor region 4 is not yet formed at the point $A_8$. The electron supply layer 42 is so thin compared to the electron transit layer 41 that it hardly affects wafer warpage; indeed, the wafer warpage after the creation of the electron supply layer 42 is practically the same as that at the point $A_8$.

By way of comparison a semiconductor wafer of conventional design was fabricated in which the buffer region consisted solely of the alternations of the multi-sublayered first buffer layer 6 and non-sublayered second buffer layer 7. The broken line curve B in the graph of FIG. 6 plots the macroscopic wafer warpage W against the nitride film thickness T in the course of the fabrication of the buffer region and main semiconductor region of the prior art wafer.

The nitride film thickness T and warpage W of the prior art wafer had the values tabulated below at points $B_1$-$B_8$ on the broken line curve in FIG. 6.

|  | Film Thickness T (μm) | Wafer Warpage W (μm) |
| --- | --- | --- |
| Point $B_1$ | 0.62 | −50 |
| Point $B_2$ | 1.22 | −60 |
| Point $B_3$ | 1.82 | −70 |
| Point $B_4$ | 2.12 | −75 |
| Point $B_5$ | 2.42 | −80 |
| Point $B_6$ | 2.72 | −85 |
| Point $B_7$ | 3.52 | +30 |
| Point $B_8$ | 4.52 | +150 |

A comparison of the two foregoing tables will reveal that the points $A_1$-$A_5$ on the solid line curve A and the points $B_1$-$B_5$ on the broken line curve B in FIG. 6 indicate the same nitride film thickness values and the same wafer warpage values. The points $B_1$, $B_2$, $B_3$, $B_4$, $B_5$ and $B_6$ on the broken line curve B represent the nitride film thicknesses, and the resulting wafer warpages, when two, four, six, seven, eight and nine alternations, respectively, of one multi-sublayered buffer layer 6 and one non-sublayered buffer layer 7 were formed on the substrate 2. At $B_6$ the fabrication of the buffer region of the prior art wafer is completed solely by the alternating buffer layers 6 and 7. On this buffer region of the prior art wafer there was grown from $B_6$ to $B_8$ a GaN layer equivalent to the electron transit layer 41, FIG. 2, of the main semiconductor region 4 of the wafer 1 according to the invention.

As is apparent from the points $B_1$-$B_6$ on the broken line curve B in FIG. 6, in the case where the buffer region was wholly made from the alternating buffer layers 6 and 7 according to the prior art, the wafer suffered an increasingly more negative warpage under the influence of the silicon substrate 2 with an increase in the thickness of the buffer region. It is therefore clear that wafer warpage is not reducible merely by increasing the buffer region of the prior art design. However, the wafer started diminishing in negative warpage, and increasing in positive warpage, from $B_6$ toward $B_8$ when the GaN layer of the main semiconductor region was being built on the prior art buffer region. The wafer warpage was as much as +150 μm at $B_8$ when the film was grown on the substrate to a thickness of 4.52 μm according to the prior art.

In contrast, when the buffer region 3 according to the prior art, comprising both first and second multilayered subregions 5 and 8, and the electron transit layer 41 of the main semiconductor region 4 were grown to the same thickness of 4.52 μm, the resulting wafer had a much less warpage of +30 μm, as at $A_8$ on the solid line curve A in FIG. 6. This significant reduction of wafer warpage according to the invention is believed to be attributable to the second multilayered buffer subregion 8 between the first multilayered buffer subregion 5 and the main semiconductor region 4, as discussed in more detail below.

As indicated between the points $A_5$ and $A_6$ on the solid line curve A in FIG. 6, the negative warpage of the wafer lessens upon growth of the second multilayered buffer subregion 8 which is less in lattice constants than the non-sublayered second layers 7 of the first buffer subregion 5. Like the first multilayered buffer subregion 5, this second multilayered buffer subregion 8 is also subject to a tensile stress, as has been explained with reference to FIG. 5. However, the tensile stress of the second buffer subregion 8 being itself much less than that of the first buffer subregion 5, and the second buffer subregion 8 being farther away from the substrate 2 than is the first buffer subregion 5, the negative wafer warpage is curbed through the mitigation of the influence of the stress due to the difference in lattice constants between the substrate and the second buffer subregion. The negative wafer warpage indeed dropped from point $A_5$ to point $A_6$ on the solid line curve A in FIG. 6.

Thereafter, upon creation of the GaN layer, equivalent to the electron transit layer 41 of the main semiconductor region 4, the noted compressive stress to which this GaN layer was subjected obviously counteracted the tensile stress on the buffer region 3. The negative warping of the wafer started dwindling at the point $A_6$ less steeply than the similar diminution of the negative warpage of the prior art wafer from $B_6$ to $B_8$. Finally, at the point $A_8$, the warpage of the wafer according to the invention shrank to +30 μm. This wafer warpage at the film thickness of 4.52 μm is appreciably less than the warpage of +150 μm of the prior art wafer at the same film thickness.

Despite the showing of FIG. 6, the changes of the wafer warpages from point to point on the two curves A and B are not continuous but stepwise. This is because the relatively thick, non-sublayered second layers 7 of the first buffer subregion 5 alternate with the multi-sublayered first layers 6 of the first buffer subregion and with the multilayered second buffer subregion 8.

Solely for the purpose of reducing the wafer warpage to a minimum, the prior art wafer attains this purpose when its warpage becomes zero between the points $B_6$ and $B_7$ on the broken line curve B in FIG. 6. But then the prior art wafer is not thick enough to provide a desired degree of antivoltage strength. Incidentally, the wafer according to the invention has its warpage zeroed when it is much thicker, between the points $A_7$ and $A_8$ on the solid line curve A.

It should also be appreciated that the wafer according to the invention has its warpage maximized at the point $A_5$, at a value less than that of the maximum warpage of the prior art wafer at $B_6$. A smaller maximum wafer warpage during the process of fabrication leads to less dislocations in the main semiconductor region 4. Furthermore, the less steep reduction of wafer warpage from $A_6$ to $A_8$ according to the invention, compared to that according to the prior art from $B_6$ to $B_8$, makes it easier to avoid fluctuations in warpage when the wafer is grown to its full thickness $P_3$, FIG. 2, in the mass production of desired semiconductor devices.

The invention as so far described in terms of its first preferred embodiment offers the following additional benefits:

1. Less warped wafers obtainable thanks to the invention not only expedite the fabrication of semiconductor devices but assure less cracks and dislocations in the main semiconductor region 4.
2. Warpage reduction is realized in wafers that are sufficiently thick for semiconductor devices to possess a desired degree of antivoltage strength.
3. Each comprised of multiple alternations of extremely thin buffer sublayers 61 and 62, the first buffer layers 6 of the first multilayered buffer subregion 5 make possible the fine adjustment of wafer warpage and the fabrication of the sufficiently thick buffer region 3.
4. Containing aluminum and having the first buffer sublayers 61 of relatively low lattice constants, the multi-sublayered first buffer layers 6 of the first multilayered buffer subregion 5 gives rise to, macroscopically, tensile stresses. The non-sublayered second buffer layers 7 of the first buffer subregion 5, on the other hand, generate compressive stresses as they either do not contain aluminum or do contain it in a less proportion than the first buffer sublayers 61 and have relatively high lattice constants. Thus the compressive stresses of the second buffer layers 7 counterbalance the tensile stresses of the first buffer layers 6 to a sufficient degree to result in substantive curtailment of the overall tensile stress of the first buffer subregion 5, so that this buffer subregion can be made thick enough.
5. The second buffer subregion 8 is easier of warpage control, and can be easily made as thick as desired, as it is made up of multiple alternations of the thin buffer layers 81 and 82.

EMBODIMENT OF FIG. 7

This modified semiconductor wafer $1_a$ is similar in construction to its FIG. 2 counterpart 1 except for a first multilayered buffer subregion $5_a$ of a buffer region $3_a$. The first buffer subregion $5_a$ of the wafer $1_a$ differs then from the first buffer subregion 5 of the buffer region 3 of the wafer 1 in the absence of that one of the non-sublayered second buffer layers 7 of the first buffer subregion 5 which forms the topmost layer of the first buffer subregion 5 in the wafer 1. Consequently, in this modified wafer $1_a$, the second buffer layers 7 of the first buffer subregion $5_a$ are one less in number than those of the first buffer subregion 5 of the wafer 1. The topmost one of the multi-sublayered first buffer layers 6 of the first buffer subregion $5_a$ forms the topmost layer of that entire subregion $5_a$ and is joined directly to the overlying second multilayered subregion 8 of the buffer region $3_a$.

In this wafer $1_a$, too, the second multilayered buffer subregion 8 is less in mean or macroscopic aluminum content, and greater in mean or macroscopic lattice constants, than the first multilayered buffer subregion $5_a$. So made, the wafer $1_a$ gains the same advantages as does the wafer 1.

EMBODIMENT OF FIG. 8

Another modified semiconductor wafer $1_b$ features a modified buffer region $3_b$, particularly its second multilayered buffer subregion $8_a$. The first multilayered buffer subregion 5 and other parts of the wafer $1_b$ are constructed as set forth above with reference to FIGS. 1-3.

Figure 8:
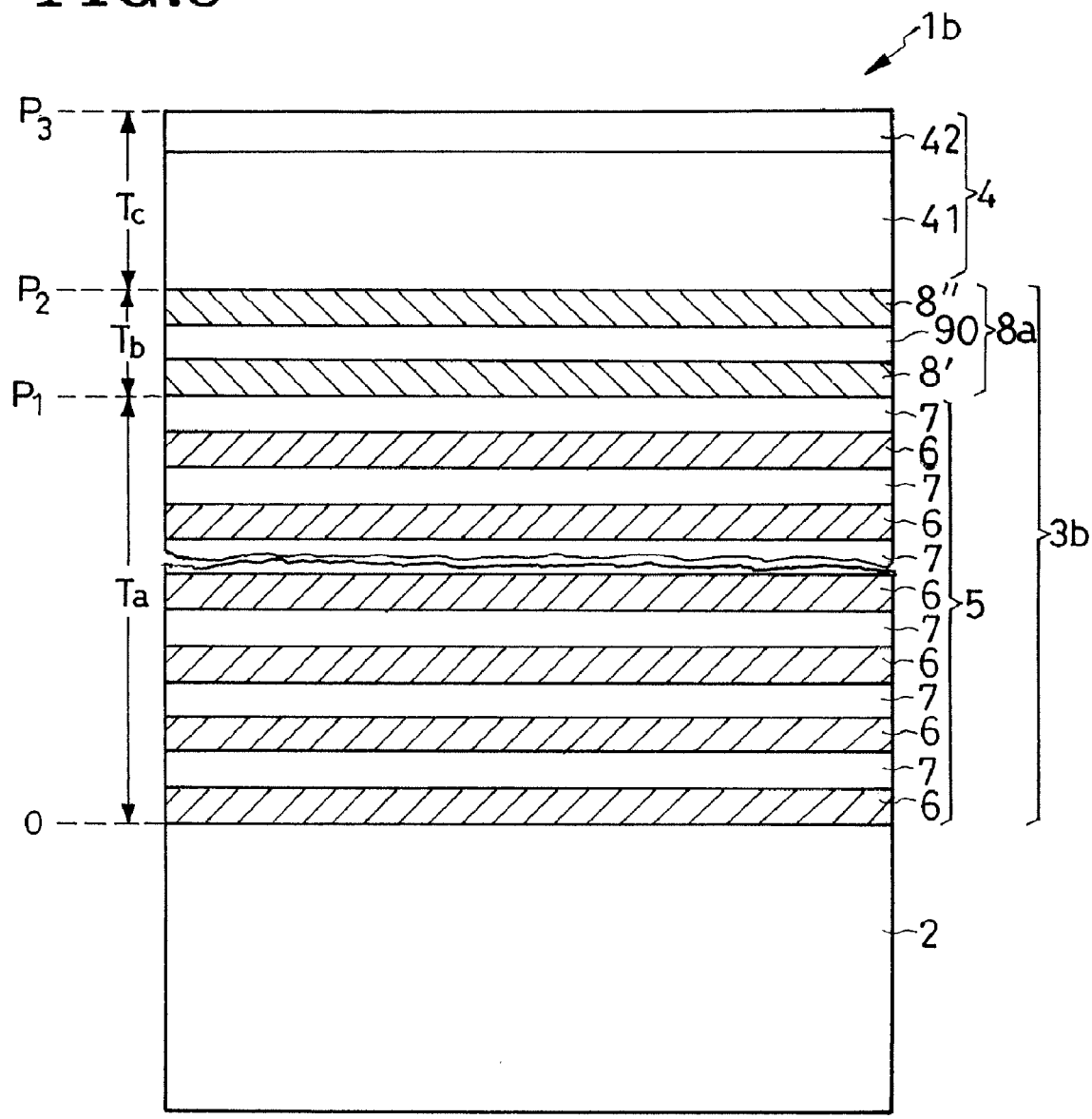
FIG. 8 is also an illustration similar to FIG. 2 but showing still another preferred form of wafer according to the invention.

The second multilayered buffer subregion $8_a$ of the buffer region $3_b$ comprises two multi-sublayered first buffer layers 8' and 8" and one non-sublayered second buffer layer 90 interposed therebetween. The multi-sublayered first buffer layers 8' and 8" of the second buffer subregion $8_a$ are each of the same construction as the second multilayered buffer subregion 8, FIG. 3, of the first disclosed wafer 1, the only difference being in the naming of the constituent "sublayers" of the first buffer layers 8' and 8" of this embodiment and the constituent "layers" of the second buffer subregion 8 of the first embodiment. The second buffer layer 90 of the second buffer subregion $8_a$ is of the same construction as the non-sublayered second buffer layers 7 of the first buffer subregion 5 of the first disclosed wafer 1. Possibly, notwithstanding the showing of FIG. 8, there may be employed for the second buffer subregion $8_a$ three or more multi-sublayered first buffer layers 8', 8", . . . in alternation with a correspondingly increased number of non-sublayered second buffer layers 90.

In this wafer $1_b$, too, the second multilayered buffer subregion $8_a$ is less in mean or macroscopic aluminum content, and greater in mean or macroscopic lattice constants, than the first multilayered buffer subregion 5. The wafer $1_b$ therefore gains the same advantages as does the wafer 1. Additionally, provided with the non-sublayered second buffer layer or layers 90 in alternation with the multi-sublayered first buffer layers 8' and 8", the wafer $1_b$ offers the benefit that the second buffer subregion $8_a$ can be made as thick as desired.

EMBODIMENT OF FIGS. 9 AND 10

Figure 7:
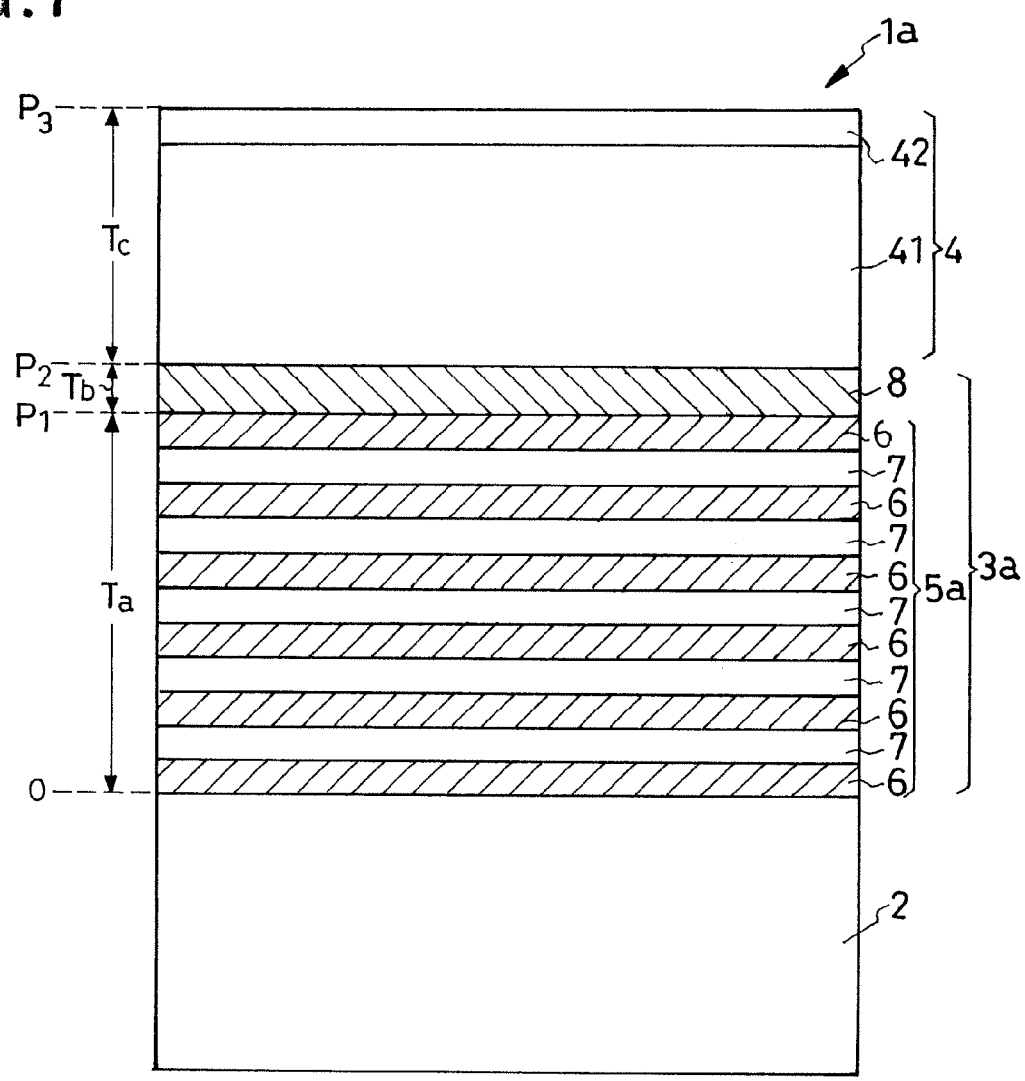
FIG. 7 is an illustration similar to FIG. 2 but showing another preferred form of wafer according to the invention.
Figure 9:
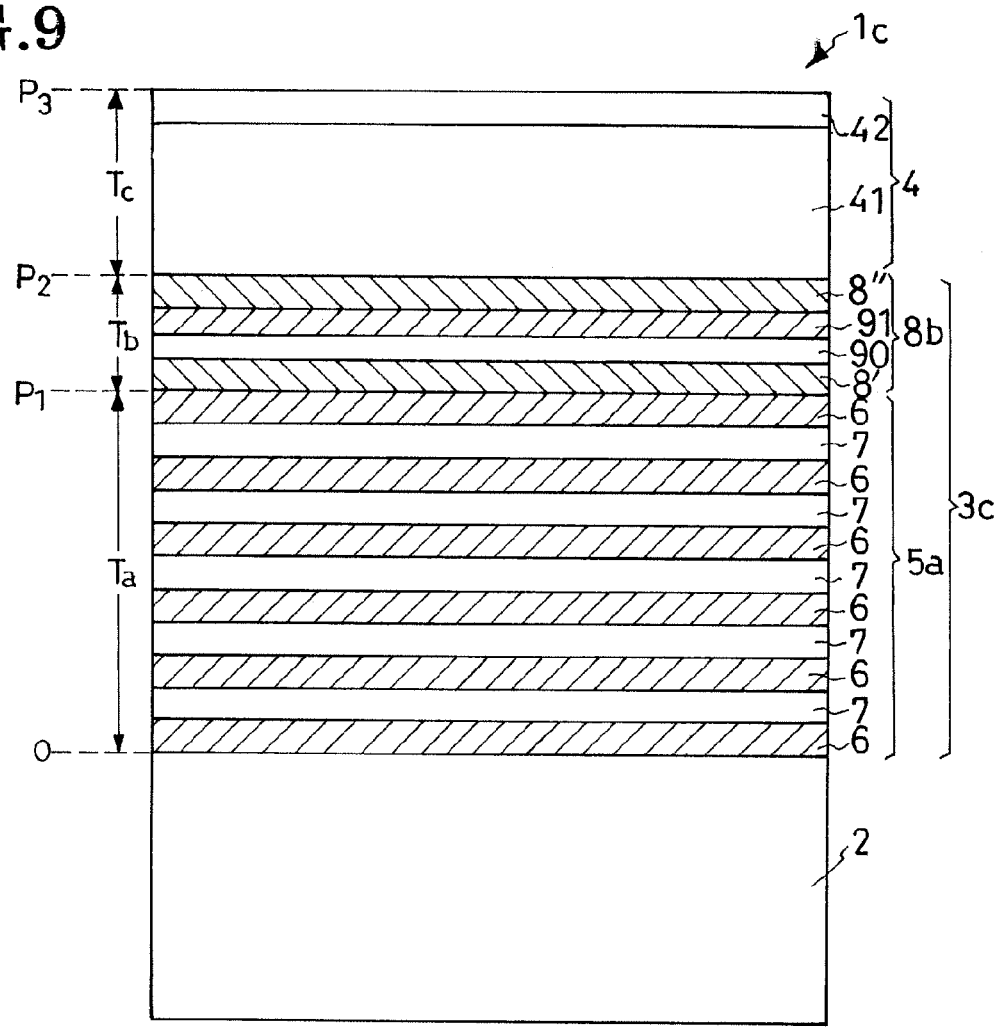
FIG. 9 is also an illustration similar to FIG. 2 but showing yet another preferred form of wafer according to the invention.

This semiconductor wafer $1_c$, FIG. 9, features both first and second multilayered buffer subregions $5_a$ and $8_b$ of its buffer region $3_c$ and is otherwise identical with the FIG. 2 embodiment. The first buffer subregion $5_a$ is of the same construction as its FIG. 7 counterpart indicated by the same reference characters. The second buffer subregion $8_b$ on the other hand is similar in construction to its FIG. 8 counterpart $8_a$ except that a multi-sublayered third buffer layer 91 is interposed between the topmost multi-sublayered first buffer layer 8" and the non-sublayered second buffer layer 90.

Figure 10:
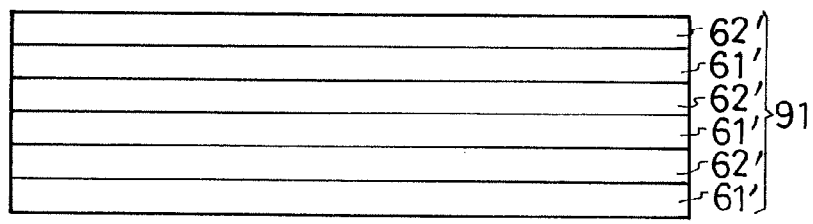
FIG. 10 is an enlarged schematic sectional illustration showing in more detail the multi-sublayered third buffer layer of the second buffer subregion of the wafer of FIG. 9.

As illustrated on an enlarged scale in FIG. 10, the third buffer layer 91 of the second buffer subregion $8_b$ is a lamination of multiple alternations of two different kinds of sublayers 61' and 62'. The first sublayers 61' of the third buffer layer 91 are of a nitride semiconductor containing aluminum in a proportion that is equal to or less than the aluminum proportion of the first constituent layers 81, FIG. 3, of the second buffer subregion 8. The second sublayers 62' of the third buffer layer 91 are of a nitride semiconductor that either does not contain aluminum or does contain it in a proportion less than the aluminum proportion of the second constituent layers 82, FIG. 3, of the second buffer subregion 8. The fabrication of this wafer will become easier if the first sublayers 61' of the third buffer layer 91 of this second buffer subregion $8_b$ are made from the same material (e.g., AlN) as the first sublayers 61, FIG. 3, of the first layers 6 of the first buffer subregion $5_a$, and the second sublayers 62' from the same material (e.g., GaN) as the second sublayers 62, FIG. 3, of the first layers 6 of the first buffer subregion $5_a$.

It will be observed in conjunction with this embodiment that the modified second buffer subregion $8_b$ of this wafer $1_c$ is less in mean or macroscopic aluminum content, and greater in mean or macroscopic lattice constants, than the first buffer subregion $5_a$. Thus the second buffer subregion $8_b$ performs the same functions as the second buffer subregion 8 of the first disclosed wafer 1. Further, incorporating the non-sublayered second layer 90, as does the second subregion $8_a$, FIG. 8, of the wafer $1_b$, the second buffer subregion $8_b$ of this wafer $1_c$ can be easily formed to a desired thickness.

EMBODIMENT OF FIG. 11

The semiconductor wafer $1_d$ shown here features modifications in both first and second multilayered buffer subregion $5_b$ and $8_c$ which in combination constitute the buffer region $3_d$ of this wafer. The other details of construction of the wafer $1_d$ are as previously described in connection with the first disclosed wafer 1.

The modified first buffer subregion $5_b$ differs from its FIGS. 2 and 3 counterpart 5 only in that each of its multi-sublayered first buffer layers $6_a$ comprises second sublayers $62_a$, $62_b$, $62_c$, and $62_d$ of different thicknesses $T_1$, $T_2$, $T_3$ and $T_4$ instead of the second sublayers 62, FIG. 3, of the same thickness in the first layers 6 of the first buffer subregion 5 of the first disclosed wafer 1. The second sublayers $62_a$-$62_d$ of different thicknesses alternate with the first sublayers 61 of the same thickness to constitute each of the first buffer layers $6_a$, which in turn alternate with the non-sublayered second buffer layers 7 to constitute the first buffer subregion $5_b$ of the buffer region $3_d$.

Made from the same semiconducting nitride (e.g., GaN) as are the second sublayers 62 of the first disclosed wafer 1, the second sublayers $62_a$-$62_d$ of each first buffer layer $6_a$ have thicknesses $T_1$, $T_2$, $T_3$ and $T_4$ which increment from the substrate 2 toward the main semiconductor region 4. The maximum thickness $T_4$ of the second buffer sublayers $62_a$-$62_d$ is less than the thickness $T_e$, FIGS. 2 and 3, of each non-sublayered second buffer layer 7.

Figure 11:
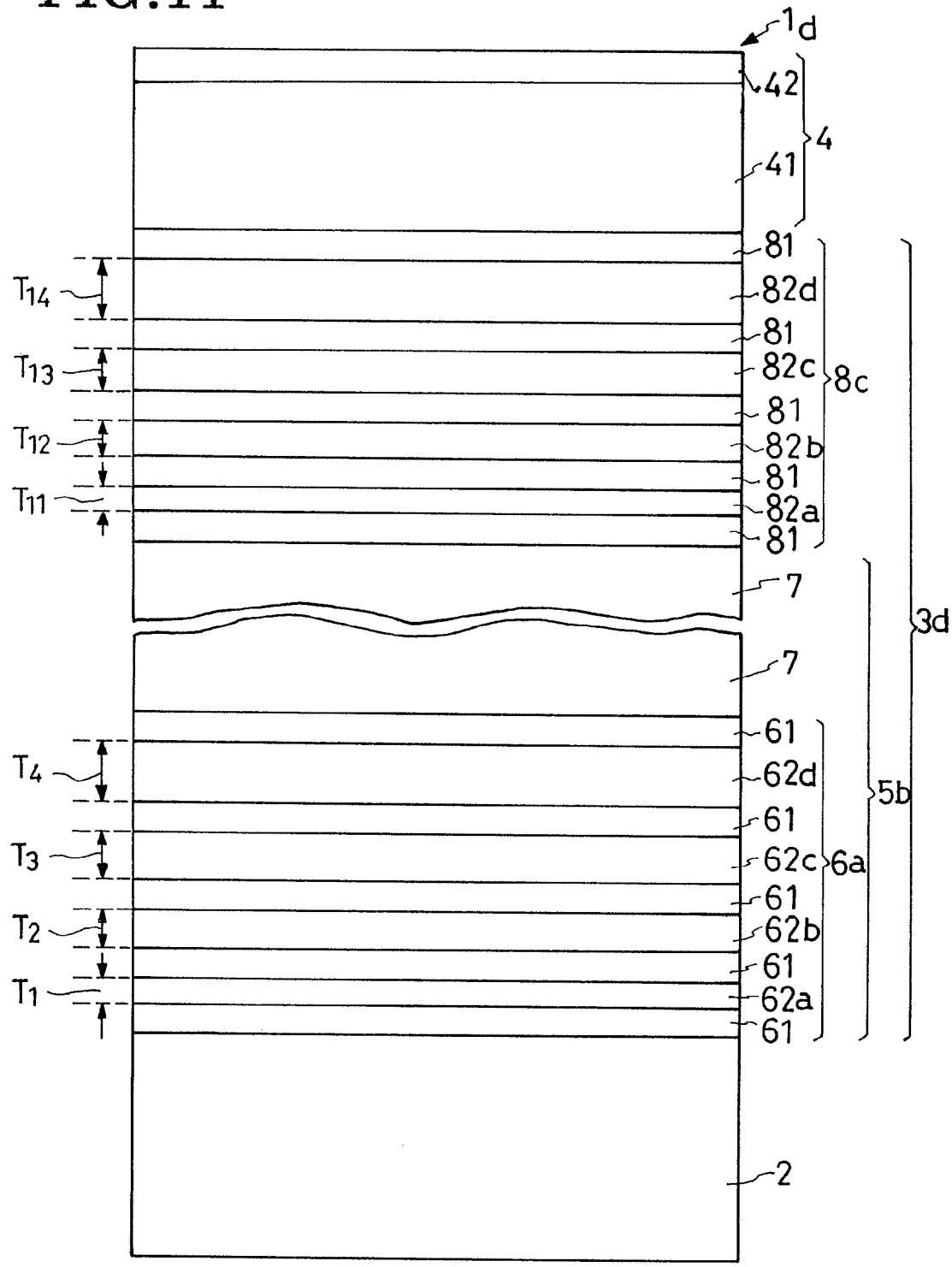
FIG. 11 is an illustration similar to FIG. 2 but showing a further preferred form of wafer according to the invention.

FIG. 11 is drawn on the assumption that the multi-sublayered first buffer layers $6_a$ of the first buffer subregion $5_b$ are all of the same configuration. In practice, however, the multi-sublayered first buffer layers $6_a$ need not be alike, all that is required being that the second sublayers $62_a$-$62_b$ of each first buffer layer $6_a$ be made incrementally thicker from the substrate 2 toward the main semiconductor region 4.

The second multilayered buffer subregion $8_c$ of the wafer $1_d$ differs from its FIGS. 2 and 3 counterpart 8 in having second buffer layers $82_a$, $82_b$, $82_c$ and $82_d$ of different thicknesses $T_{11}$, $T_{12}$, $T_{13}$ and $T_{14}$ instead of the second buffer layers 82 of the same thickness in the second buffer subregion 8 of the first disclosed wafer 1. The thicknesses $T_{11}$-$T_{14}$ of the second buffer layers $82_a$-$82_d$ become progressively greater from the first multilayered buffer subregion $5_b$ toward the main semiconductor region 4. The second buffer layers $82_a$-$82_d$ alternate with the first buffer layers 81 to constitute the second buffer subregion $8_c$ of the buffer region $3_d$. The first buffer layers 81 and second buffer layers $82_a$-$82_d$ of the second buffer subregion $8_c$ are of the same compositions as the first and second layers 81 and 82, FIG. 3, of the second buffer subregion 8 of the buffer region 3 of the first disclosed wafer 1.

This wafer $1_d$ is built upon the same concepts of the invention as those underlying the first disclosed wafer 1. Namely, the second multilayered buffer subregion $8_c$ of the wafer $1_d$ is less in mean or macroscopic aluminum content, and higher in mean or macroscopic lattice constants, than the first multilayered buffer subregion 5. The wafer $1_d$ therefore possesses the same advantages as does the wafer 1.

Additionally, in this embodiment of the invention, the first multilayered buffer subregion $6_a$ includes the second sublayers $62_a$-$62_d$ of different thicknesses $T_1$-$T_4$, and the second multilayered buffer subregion $8_c$ the second buffer layers $82_a$-$82_d$ of different thicknesses $T_{11}$-$T_{14}$. The second sublayers $62_a$-$62_d$, and $82_a$-$82_d$, of the buffer subregions $6_a$ and $8_c$ are both relatively low in aluminum content and closer in lattice constants to the main semiconductor region 4 than the first layers 61 and 81 of the buffer subregions $6_a$ and $8_c$. Furthermore, as these second sublayers $62_a$-$62_d$ and $82_a$-$82_d$ of the buffer subregions $6_a$ and $8_c$ incrementally grow higher in macroscopic lattice constants from the substrate 2 toward the main semiconductor region 4 and become closer to the latter, significant improvements are accomplished in the reduction of the warpage, cracking, and dislocations of the main semiconductor region.

POSSIBLE MODIFICATIONS

Notwithstanding the foregoing detailed disclosure it is not desired that the present invention be limited by the exact showings of the drawings or the description thereof. The following is a brief list of possible modifications, alterations or adaptations of the illustrated representative semiconductor devices which are all believed to fall within the purview of the claims annexed hereto:

1. The invention is applicable to the fabrication of various semiconductor devices other than HEMTs, such as MESFETs, SBDs, and LEDs.
2. The non-sublayered second layers 7 of the first buffer subregion could be made from a material different from that of second sublayers 62 of the multi-sublayered first layers 6 of the first multilayered buffer subregion, although they should be made from the same material purely from the standpoint of facilitation of manufacture.
3. The auxiliary electrode 94 could be connected to the drain 92 instead of to the source 91.
4. An additional buffer layer such as that of AlN could be provided between the silicon substrate 2 and the buffer region 3 or $3_a$-$3_d$.
5. An additional layer such as that of AlN could also be interposed in the main semiconductor region 4.
6. Both buffer region 3 or $3_a$-$3_d$ and main semiconductor region 4 maybe made from semiconducting compounds other than nitride, such as those of Groups III-V.

What is claimed is:

1. A semiconductor wafer for use in fabrication of semiconductor devices, the wafer comprising:
   (A) a substrate;
   (B) a buffer region formed on the substrate and made from semiconducting compounds, the buffer region comprising:
   (a) a first multilayered buffer subregion formed on the substrate, the first multilayered buffer subregion comprising alternations of a multi-sublayered first buffer layer and a non-sublayered second buffer layer, each multi-sublayered first buffer layer of the first multilayered buffer subregion comprising alternations of a first and a second buffer sublayer, the first buffer sublayers of the multi-sublayered first buffer layers being each thinner than each non-sublayered second buffer layer and being less in lattice constants than the substrate, the second buffer sublayers of the multi-sublayered first buffer layers being each thinner than each non-sublayered second buffer layer and being intermediate in lattice constants between the first buffer sublayers of the multi-sublayered first buffer layers and the substrate, the non-sublayered second buffer layers of the first multilayered buffer subregion being each thicker than each first and each second buffer sublayer of each multi-sublayered first buffer layer of the first multilayered buffer subregion and being intermediate in lattice constants between the first buffer sublayers of the multi-sublayered first buffer layers and the substrate; and
   (b) a second multilayered buffer subregion formed on the first multilayered buffer subregion of the buffer region, the second multilayered buffer subregion comprising alternations of a first and a second buffer layer, the first buffer layers of the second multilayered buffer subregion being each thinner than each non-sublayered second buffer layer of the first multilayered buffer subregion and less in lattice constants than the substrate, the second buffer layers of the second multilayered buffer subregion being each thinner than each non-sublayered second buffer layer of the first multilayered buffer subregion and being intermediate in lattice constants between the first buffer layers of the second multilayered buffer subregion and the substrate; and
   (C) a main semiconductor region of semiconducting compounds formed on the buffer region to provide desired semiconductor devices;
   (D) the first multilayered buffer subregion of the buffer region being less in mean lattice constants than the main semiconductor region;
   (E) the second multilayered buffer subregion of the buffer region being intermediate in mean lattice constants between the first multilayered buffer subregion of the buffer region and the main semiconductor region.

2. A semiconductor wafer as defined in claim 1, wherein the substrate is made from a material selected from the group consisting of silicon, silicon compounds, and sapphire.

3. A semiconductor wafer as defined in claim 1, wherein the first sublayers of the multi-sublayered first buffer layers of the first multilayered buffer subregion of the buffer region are made from a semiconducting nitride containing aluminum in a first proportion, wherein the second sublayers of the multi-sublayered first buffer layers of the first multilayered buffer subregion of the buffer region are made from a semiconducting nitride containing aluminum in a second proportion which is equal to or greater than zero and less than the first proportion, wherein the non-sublayered second buffer layers of the first multilayered buffer subregion are made from a semiconducting nitride containing aluminum in a third proportion which is equal to or greater than zero and less than the first proportion, wherein the first buffer layers of the second multilayered buffer subregion of the buffer region are made from a semiconducting nitride containing aluminum in a fourth proportion, and wherein the second buffer layers of the second multilayered buffer subregion of the buffer region are made from a semiconducting nitride containing aluminum in a fifth proportion which is equal to or greater than zero and less than the fourth proportion.

4. A semiconductor wafer as defined in claim 3, wherein the second buffer layers of the second multilayered buffer region of the buffer region are each thicker than each second sublayer of the multi-sublayered first buffer layers of the first multilayered buffer subregion of the buffer region.

5. A semiconductor wafer as defined in claim 3, wherein the main semiconductor region is made from a semiconducting nitride having a mean aluminum content that is equal to or greater than zero and less than the fourth proportion.

6. A semiconductor wafer as defined in claim 1, wherein the multi-sublayered first buffer layers of the first multilayered buffer subregion of the buffer region are one more in number than the non-sublayered second buffer layers of the first multilayered buffer subregion of the buffer region and include one that is placed contiguous to the substrate and another that is placed contiguous to the second multilayered buffer subregion of the buffer region.

7. A semiconductor wafer as defined in claim 1, wherein the second sublayers of each multi-sublayered first buffer layer of the first multilayered buffer subregion of the buffer region progressively grow thicker from the substrate toward the main semiconductor region.

8. A semiconductor wafer as defined in claim 1, wherein the second layers of the second multilayered buffer subregion of the buffer region progressively grow thicker from the substrate toward the main semiconductor region.

9. A semiconductor wafer as defined in claim 1, wherein the non-sublayered second buffer layers of the first multilayered buffer subregion of the buffer region, the second sublayers of the multi-sublayered first buffer layers of the first multilayered buffer subregion of the buffer region, and the second layers of the second multilayered buffer subregion of the buffer region are all made from the same semiconducting nitride.

10. A semiconductor wafer as defined in claim 1, wherein the multi-sublayered first buffer layers of the first multilayered buffer subregion of the buffer region are each from about five nanometers to about 1000 nanometers thick, and wherein the non-sublayered second buffer layers of the first multilayered buffer subregion of the buffer region are each from about 100 nanometers to about 400 nanometers thick.

11. A semiconductor wafer for use in fabrication of semiconductor devices, the wafer comprising:
(A) a substrate;
(B) a buffer region formed on the substrate and made from semiconducting compounds, the buffer region comprising:
(a) a first multilayered buffer subregion formed on the substrate, the first multilayered buffer subregion comprising alternations of a multi-sublayered first buffer layer and a non-sublayered second buffer layer, each multi-sublayered first buffer layer of the first multilayered buffer subregion comprising alternations of a first and a second buffer sublayer, the first buffer sublayers of the multi-sublayered first buffer layers being each thinner than each non-sublayered second buffer layer and being less in lattice constants than the substrate, the second buffer sublayers of the multi-sublayered first buffer layers being each thinner than each non-sublayered second buffer layer and being intermediate in lattice constants between the first buffer sublayers of the multi-sublayered first buffer layers and the substrate, the non-sublayered second buffer layers of the first multilayered buffer subregion being each thicker than each first and each second buffer sublayer of each multi-sublayered first buffer layer of the first multilayered buffer subregion and being intermediate in lattice constants between the first buffer sublayers of the multi-sublayered first buffer layers and the substrate; and
(b) a second multilayered buffer subregion formed on the first multilayered buffer subregion of the buffer region, the second multilayered buffer subregion comprising at least two multi-sublayered first buffer layers and a non-sublayered second buffer layer interposed therebetween, each multi-sublayered first buffer layer of the second multilayered buffer subregion comprising alternations of a first and a second buffer sublayer, the first buffer sublayers of the multi-sublayered first buffer layers of the second multilayered buffer subregion being each thinner than the non-sublayered second buffer layer of the second multilayered buffer subregion and being less in lattice constants than the substrate, the second buffer sublayers of the multi-sublayered first buffer layers of the second multilayered buffer subregion being each thinner than the non-sublayered second buffer layer of the second multilayered buffer subregion and being intermediate in lattice constants between the first buffer sublayers of the multi-sublayered first buffer layers of the second multilayered buffer subregion and the substrate; and
(C) a main semiconductor region of semiconducting compounds formed on the buffer region to provide desired semiconductor devices;
(D) the first multilayered buffer subregion of the buffer region being less in mean lattice constants than the main semiconductor region;
(E) the second multilayered buffer subregion of the buffer region being intermediate in mean lattice constants between the first multilayered buffer subregion of the buffer region and the main semiconductor region.

12. A semiconductor wafer as defined in claim 11, wherein the second sublayers of each multi-sublayered first buffer layer of the first multilayered buffer subregion of the buffer region progressively grow thicker from the substrate toward the main semiconductor region.

13. A semiconductor wafer as defined in claim 11, wherein the second layers of the second multilayered buffer subregion of the buffer region progressively grow thicker from the substrate toward the main semiconductor region.

14. A semiconductor wafer as defined in claim 11, wherein the non-sublayered second buffer layers of the first multilayered buffer subregion of the buffer region, the second sublayers of the multi-sublayered first buffer layers of the first multilayered buffer subregion of the buffer region, and the second layers of the second multilayered buffer subregion of the buffer region are all made from the same semiconducting nitride.

15. A semiconductor wafer as defined in claim 11, wherein the multi-sublayered first buffer layers of the first multilayered buffer subregion of the buffer region are each from about five nanometers to about 1000 nanometers thick, and wherein the non-sublayered second buffer layers of the first multilayered buffer subregion of the buffer region are each from about 100 nanometers to about 400 nanometers thick.

16. A semiconductor wafer for use in fabrication of semiconductor devices, the wafer comprising:
(A) a substrate;
(B) a buffer region formed on the substrate and made from semiconducting compounds, the buffer region comprising:

(a) a first multilayered buffer subregion formed on the substrate, the first multilayered buffer subregion comprising alternations of a multi-sublayered first buffer layer and a non-sublayered second buffer layer, each multi-sublayered first buffer layer of the first multilayered buffer subregion comprising alternations of a first and a second buffer sublayer, the first buffer sublayers of the multi-sublayered first buffer layers being each thinner than each non-sublayered second buffer layer and being less in lattice constants than the substrate, the second buffer sublayers of the multi-sublayered first buffer layers being each thinner than each non-sublayered second buffer layer and being intermediate in lattice constants between the first buffer sublayers of the multi-sublayered first buffer layers and the substrate, the non-sublayered second buffer layers of the first multilayered buffer subregion being each thicker than each first and each second buffer sublayer of each multi-sublayered first buffer layer of the first multilayered buffer subregion and being intermediate in lattice constants between the first buffer sublayers of the multi-sublayered first buffer layers and the substrate; and (b) a second multilayered buffer subregion formed on the first multilayered buffer subregion of the buffer region, the second multilayered buffer subregion comprising at least two multi-sublayered first buffer layers and, interposed therebetween, a non-sublayered second buffer layer and a multi-sublayered third buffer layer, each multi-sublayered first buffer layer of the second multilayered buffer subregion comprising alternations of a first and a second buffer sublayer, the first buffer sublayers of the multi-sublayered first buffer layers of the second multilayered buffer subregion being each thinner than the non-sublayered second buffer layer of the second multilayered buffer subregion and being less in lattice constants than the substrate, the second buffer sublayers of the multi-sublayered first buffer layers of the second multilayered buffer subregion being each thinner than the non-sublayered second buffer layer of the second multilayered buffer subregion and being intermediate in lattice constants between the first buffer sublayers of the multi-sublayered first buffer layers of the second multilayered buffer subregion and the substrate, the multi-sublayered third buffer layer of the second multilayered buffer subregion comprising alternations of a first and a second buffer sublayer, the first buffer sublayers of the multi-sublayered third buffer layer of the second multilayered buffer subregion being each thinner than the non-sublayered second buffer layer of the second multilayered buffer subregion and being less in lattice constants than the substrate, the second buffer sublayers of the multi-sublayered third buffer layer of the second multilayered buffer subregion being each thinner than the non-sublayered second buffer layer of the second multilayered buffer subregion and being intermediate in lattice constants between the first buffer sublayers of the multi-sublayered third buffer layer of the second multilayered buffer subregion and the substrate; and (C) a main semiconductor region of semiconducting compounds formed on the buffer region to provide desired semiconductor devices;

(D) the first multilayered buffer subregion of the buffer region being less in mean lattice constants than the main semiconductor region;

(E) the second multilayered buffer subregion of the buffer region being intermediate in mean lattice constants between the first multilayered buffer subregion of the buffer region and the main semiconductor region.

17. A semiconductor wafer as defined in claim 16, wherein the second sublayers of each multi-sublayered first buffer layer of the first multilayered buffer subregion of the buffer region progressively grow thicker from the substrate toward the main semiconductor region.

18. A semiconductor wafer as defined in claim 16, wherein the second layers of the second multilayered buffer subregion of the buffer region progressively grow thicker from the substrate toward the main semiconductor region.

19. A semiconductor wafer as defined in claim 16, wherein the non-sublayered second buffer layers of the first multilayered buffer subregion of the buffer region, the second sublayers of the multi-sublayered first buffer layers of the first multilayered buffer subregion of the buffer region, and the second layers of the second multilayered buffer subregion of the buffer region are all made from the same semiconducting nitride.

20. A semiconductor wafer as defined in claim 16, wherein the multi-sublayered first buffer layers of the first multilayered buffer subregion of the buffer region are each from about five nanometers to about 1000 nanometers thick, and wherein the non-sublayered second buffer layers of the first multilayered buffer subregion of the buffer region are each from about 100 nanometers to about 400 nanometers thick.

21. A semiconductor device comprising:

(A) a substrate having a pair of opposite major surfaces;

(B) a buffer region formed on one of the pair of opposite major surfaces of the substrate and made from semiconducting compounds, the buffer region comprising:

(a) a first multilayered buffer subregion formed on the substrate, the first multilayered buffer subregion comprising alternations of a multi-sublayered first buffer layer and a non-sublayered second buffer layer, each multi-sublayered first buffer layer of the first multilayered buffer subregion comprising alternations of a first and a second buffer sublayer, the first buffer sublayers of the multi-sublayered first buffer layers being each thinner than each non-sublayered second buffer layer and being less in lattice constants than the substrate, the second buffer sublayers of the multi-sublayered first buffer layers being each thinner than each non-sublayered second buffer layer and being intermediate in lattice constants between the first buffer sublayers of the multi-sublayered first buffer layers and the substrate, the non-sublayered second buffer layers of the first multilayered buffer subregion being each thicker than each first and each second buffer sublayer of each multi-sublayered first buffer layer of the first multilayered buffer subregion and being intermediate in lattice constants between the first buffer sublayers of the multi-sublayered first buffer layers and the substrate; and (b) a second multilayered buffer subregion formed on the first multilayered buffer subregion of the buffer region, the second multilayered buffer subregion comprising alternations of a first and a second buffer layer, the first buffer layers of the second multilayered buffer subregion being each thinner than each non-sublayered second buffer layer of the first buffer subregion and being less in lattice constants than the substrate, the second buffer layers of the second multilayered buffer subregion being each thinner than each non-sublayered second buffer layer of the first buffer subregion and being intermediate in lattice constants between the first buffer layers of the second multilayered buffer subregion and the substrate;

(C) a main semiconductor region of semiconducting compounds formed on the buffer region to provide desired semiconductor devices, the first multilayered buffer subregion of the buffer region being less in mean lattice constants than the main semiconductor region, the second multilayered buffer subregion of the buffer region being intermediate in mean lattice constants between the first multilayered buffer subregion of the buffer region and the main semiconductor region;

(D) at least two main electrodes on the main semiconductor region;

(E) a control electrode on the main semiconductor region for controlling current flow between the main electrodes; and (F) an auxiliary electrode on the other of the pair of opposite major surfaces of the substrate, the auxiliary electrode being electrically coupled to one of the main electrodes.

22. A method of making a semiconductor wafer for use in fabrication of semiconductor devices, which comprises:

(a) providing a substrate having a prescribed lattice constant;

(b) forming on the substrate a multi-sublayered first buffer layer of a first multilayered buffer subregion of a buffer region by alternately creating a first and a second buffer sublayer a prescribed number of times from semiconducting compounds, the first buffer sublayers of the multi-sublayered first buffer layer being less in lattice constants than the substrate, the second buffer layers of the multi-sublayered first buffer layer being intermediate in lattice constants between the first buffer sublayers of the multi-sublayered first buffer layer and the substrate;

(c) forming a non-sublayered second buffer layer of the first multilayered buffer subregion of the buffer region from a semiconducting compounds on the multi-sublayered first buffer layer of the first multilayered buffer subregion to a thickness greater than that of each second buffer sublayer of the multi-sublayered first buffer layer, the non-sublayered second buffer layer of the first multilayered buffer subregion being intermediate in lattice constants between the first buffer sublayers of the multi-sublayered first buffer layer and the substrate;

(d) alternately repeating steps (b) and (c) a prescribed number of times thereby completing the first multilayered buffer subregion, which comprises the alternations of the multi-sublayered first buffer layer and the non-sublayered second buffer layer, of the buffer region;

(e) forming a second multilayered buffer subregion on the first multilayered buffer subregion to complete the buffer region, the second multilayered buffer subregion being formed by alternately creating a first and a second buffer layer a prescribed number of times from semiconducting compounds, the first buffer layers of the second multilayered buffer subregion being each thinner than each non-sublayered second buffer layer of the first buffer subregion and being less in lattice constants than the substrate, the second buffer layers of the second multilayered buffer subregion being each thinner than each non-sublayered second buffer layer of the first buffer subregion and being intermediate in lattice constants between the first buffer layers of the second multilayered buffer subregion and the substrate, the second multilayered buffer subregion as a whole being higher in mean lattice constants than the first multilayered buffer subregion;

(f) forming a main semiconductor region on the buffer region from semiconducting compounds to provide desired semiconductor devices, the main semiconductor region being greater in mean lattice constants than the first and the second multilayered buffer subregion.

* * * * *